United States Patent
Evans et al.

(10) Patent No.: US 10,651,627 B2
(45) Date of Patent: May 12, 2020

(54) PHOTONIC INTEGRATED CIRCUIT

(71) Applicant: Infinera Corporation, Sunnyvale, CA (US)

(72) Inventors: Peter W. Evans, Tracy, CA (US); Jeffrey T. Rahn, Sunnyvale, CA (US); Vikrant Lal, Sunnyvale, CA (US); Miguel Iglesias Olmedo, Sunnyvale, CA (US); Amir Hosseini, Sunnyvale, CA (US); Parmijit Samra, Fremont, CA (US); Scott Corzine, Sunnyvale, CA (US); Ryan W. Going, Sunnyvale, CA (US)

(73) Assignee: Infinera Corporaton, Sunnyvale, CA (US)

( * ) Notice: Subject to any disclaimer, the term of this patent is extended or adjusted under 35 U.S.C. 154(b) by 109 days.

(21) Appl. No.: 15/398,714

(22) Filed: Jan. 4, 2017

(65) Prior Publication Data

US 2017/0195055 A1  Jul. 6, 2017
US 2018/0323877 A9  Nov. 8, 2018

Related U.S. Application Data

(60) Provisional application No. 62/274,377, filed on Jan. 4, 2016, provisional application No. 62/379,682, filed on Aug. 25, 2016.

(51) Int. Cl.
*H04B 10/25* (2013.01)
*H01S 5/10* (2006.01)
(Continued)

(52) U.S. Cl.
CPC ........ *H01S 5/1017* (2013.01); *G02B 6/12004* (2013.01); *G02B 6/2813* (2013.01);
(Continued)

(58) Field of Classification Search
CPC ............... H01S 5/0612; H01S 5/02453; H01S 5/02461; H01S 5/0261; H01S 5/0425;
(Continued)

(56) References Cited

U.S. PATENT DOCUMENTS 7,778,295 B2   8/2010  Matsui et al.
8,515,285 B2 *  8/2013  DeSalvo .......... H04B 10/25758
                                             398/140
(Continued)

OTHER PUBLICATIONS

International Search Report and Written Opinion of International Application No. PCT/US2017/012229, dated Apr. 24. 2017, 14 pages.

*Primary Examiner* — Tesfaldet Bocure
(74) *Attorney, Agent, or Firm* — David L. Soltz; Fish & Richardson P.C.

(57) ABSTRACT

Methods, systems, and apparatus, including an optical receiver including an optical source, including a substrate; a laser provided on the substrate, the laser having first and second sides and outputting first light from the first side and second light from the second side, the first light output from the first side of the laser has a first power and the second light output from the second side has a second power; and a first modulator that receives the first light and a second modulator that receives the second light, such that the power of the first light at an input of the first modulator is substantially equal to the power of the second light at an input of the second modulator.

15 Claims, 21 Drawing Sheets

(51) Int. Cl.
| | |
|---|---|
| H01S 5/024 | (2006.01) |
| H01S 5/026 | (2006.01) |
| H01S 5/042 | (2006.01) |
| H01S 5/06 | (2006.01) |
| H01S 5/22 | (2006.01) |
| H01S 5/30 | (2006.01) |
| G02B 6/28 | (2006.01) |
| H04B 10/50 | (2013.01) |
| H04B 10/61 | (2013.01) |
| G02F 1/225 | (2006.01) |
| H04B 10/2507 | (2013.01) |
| H04B 10/40 | (2013.01) |
| H04B 10/67 | (2013.01) |
| H01S 5/0625 | (2006.01) |
| G02B 6/12 | (2006.01) |
| G02B 26/04 | (2006.01) |
| H01S 5/12 | (2006.01) |
| H01S 5/20 | (2006.01) |
| H01S 5/32 | (2006.01) |
| G02F 1/21 | (2006.01) |

(52) U.S. Cl.
CPC ........... *G02B 26/04* (2013.01); *G02F 1/2255* (2013.01); *G02F 1/2257* (2013.01); *H01S 5/0261* (2013.01); *H01S 5/02453* (2013.01); *H01S 5/02461* (2013.01); *H01S 5/0425* (2013.01); *H01S 5/0612* (2013.01); *H01S 5/06256* (2013.01); *H01S 5/1003* (2013.01); *H01S 5/22* (2013.01); *H01S 5/3013* (2013.01); *H04B 10/2507* (2013.01); *H04B 10/40* (2013.01); *H04B 10/503* (2013.01); *H04B 10/616* (2013.01); *H04B 10/67* (2013.01); *G02B 2006/12121* (2013.01); *G02F 2001/212* (2013.01); *G02F 2201/58* (2013.01); *H01S 5/1014* (2013.01); *H01S 5/1215* (2013.01); *H01S 5/2081* (2013.01); *H01S 5/3214* (2013.01); *H01S 2301/176* (2013.01)

(58) Field of Classification Search
CPC .. H01S 5/06256; H01S 5/1003; H01S 5/1017; H01S 5/22; H01S 5/3013; G02B 6/12004; G02B 6/2813; G02B 26/04; G02F 1/2255; G02F 1/2257; H04B 10/2507; H04B 10/40; H04B 10/503; H04B 10/616; H04B 10/67
See application file for complete search history.

(56) References Cited

U.S. PATENT DOCUMENTS

| | | | |
|---|---|---|---|
| 9,749,060 B1* | 8/2017 | Wang | H04B 10/0731 |
| 10,181,696 B2* | 1/2019 | Evans | G02F 1/2257 |
| 2010/0247021 A1 | 9/2010 | Cunningham et al. | |
| 2010/0311195 A1 | 12/2010 | Matsui et al. | |
| 2014/0010248 A1 | 1/2014 | Larson | |
| 2018/0198531 A1* | 7/2018 | Bhandare | H04B 10/588 |

* cited by examiner

US 10,651,627 B2

PHOTONIC INTEGRATED CIRCUIT

CROSS-REFERENCE TO RELATED APPLICATION

This patent application claims the benefit of U.S. Provisional Patent Application No. 62/274,377, filed Jan. 4, 2016, and U.S. Provisional Patent Application No. 62/379,682, filed Aug. 25, 2016 which are incorporated by reference herein.

TECHNICAL FIELD

The present disclosure is directed to a control of a tunable laser implemented on a photonic integrated circuit. For example, a laser may be integrated on an optical transmitter to transmit an optical signal. As another example, a laser may be integrated on a coherent optical receiver as a local oscillator source for detecting an incoming optical signal in a coherent manner.

SUMMARY

In a general aspect, the subject matter described in this specification can be embodied in an optical receiver including an optical source, including a substrate; a laser provided on the substrate, the laser having first and second sides and outputting first light from the first side and second light from the second side, the first light output from the first side of the laser has a first power and the second light output from the second side has a second power; and a first modulator that receives the first light and a second modulator that receives the second light, such that the power of the first light at an input of the first modulator is substantially equal to the power of the second light at an input of the second modulator.

The details of one or more implementations are set forth in the accompanying drawings and the description below. Other potential features and advantages will become apparent from the description, the drawings, and the claims.

DETAILED DESCRIPTION

Figure 1:
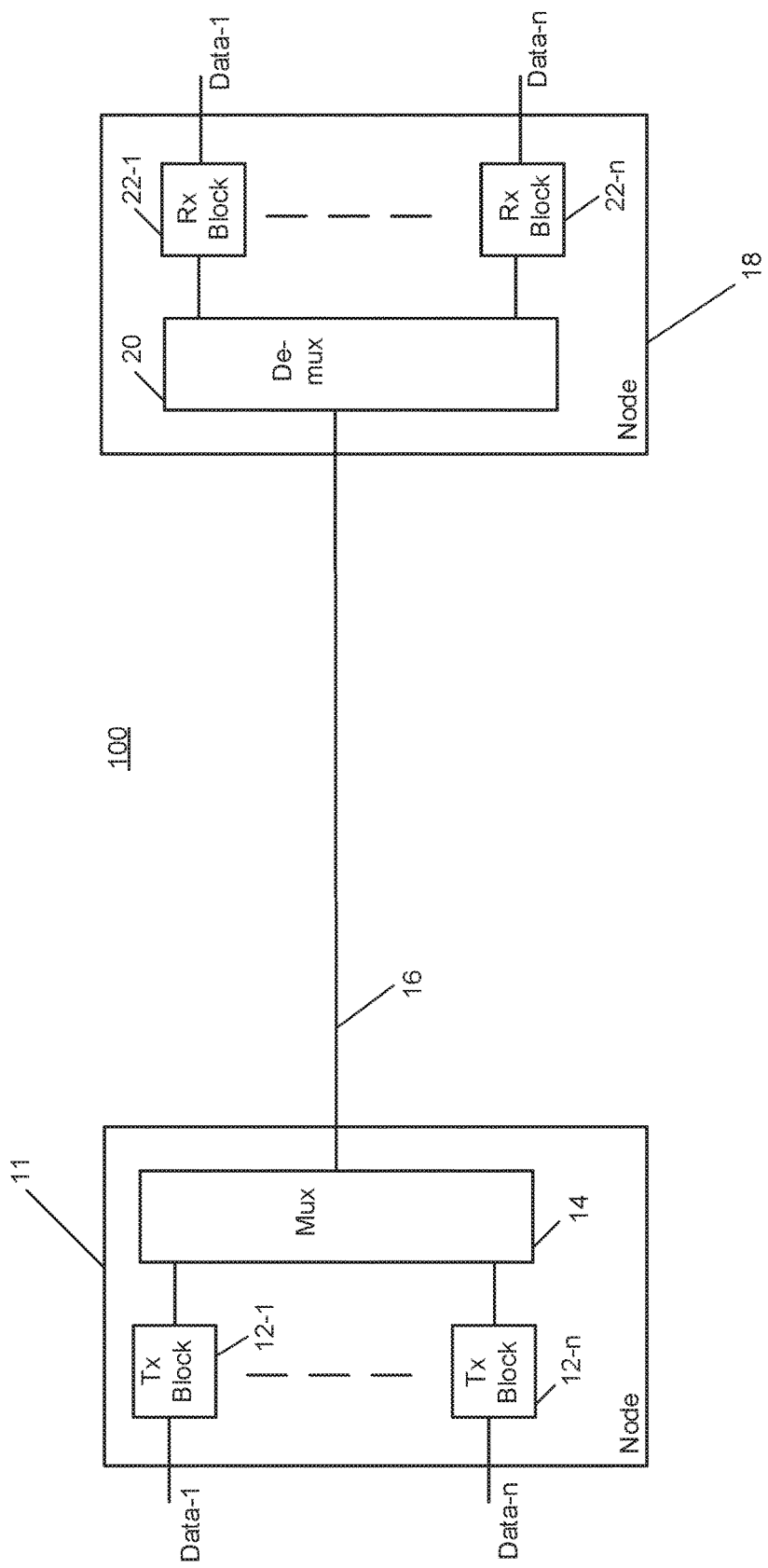
FIG. 1 shows a block diagram of an optical communication consistent with the present disclosure.

Reference will now be made in detail to the present exemplary embodiments of the present disclosure, which are illustrated in the accompanying drawings. Wherever possible, the same reference numbers will be used throughout the drawings to refer to the same or like parts.

A tunable laser enables an operating wavelength of a laser to be adjusted over a tunable wavelength range. Tunable lasers such as semiconductor laser diodes typically have a gain section and an optional phase section provided between a pair of reflectors or mirrors. The gain section includes a p-n junction, and the phase section adjusts the phase of light in the laser cavity between the reflectors. A reflector may be a grating-based reflector, which includes a waveguide having a periodic refractive index variation (or grating) corresponding to a particular wavelength of light output from the laser. For example, the reflectors have a reflectivity characteristic that includes a series of uniformly spaced reflection peaks, which resemble a comb. The spectral distance between successive peaks in the comb or pitch of one reflector may be different than the spectral distance between successive peaks of the other reflector. Each "comb" may be spectrally shifted by tuning the reflectors and phase sections to select a single wavelength over a wide range, such as the C-Band (1530-1565 nm), L-Band (1565-1625 nm), extended C-Band, or extended L-Band. The grating-based reflector may be a partial reflector or a total reflector.

In some implementations, the grating-based reflectors may be used to tune the wavelength or the power of light output from the laser. For example, an operating wavelength of a laser may be tuned using heaters that are provided above and/or adjacent to the grating-based reflectors. The heaters adjust the temperature of the grating-based reflectors, such that the effective pitch of the periodic refractive index variation changes. The change in the optical pitch of the periodic refractive index variation changes the reflectivity characteristic of the reflector, and as a result may change the wavelength or the power of light output from the laser.

Tunable semiconductor lasers may be provided on or integrated with other optical devices on a common substrate, as a photonic integrated circuit (PIC). Such other devices include, but are not limited to, waveguides, modulators (e.g., Mach-Zehnder (MZ) modulators), couplers (e.g., multimode interference (MMI) couplers), optical combiners, splitters, multiplexers, demultiplexers, variable optical attenuators, semiconductor optical amplifiers, optical hybrids, and photodiodes. The laser may be configured such that light output from both sides or facets of the laser is supplied to a respective one of these devices. Often, the polarization of light output from one side of the laser is rotated relative to the polarization of light output from the other side of the laser following optical processing, such as modulation, of the laser light. In one example, the light output from both sides of the laser has a transverse electric (TE) polarization and the polarization rotated optical signal has a transverse magnetic (TM) polarization. The resulting optical signals, each having a different polarization, may then be combined to provide a polarization multiplexed optical signal having a higher capacity than optical signal having a single polarization.

Light output from one side of the laser, however, may propagate over a different distance or over a different optical path in the PIC or may travel through different devices than light output from the other side of the laser. Accordingly, the optical loss experienced by light output from one side of the laser may be different than the loss experienced by light output from the other side of the laser. As a result, following polarization rotation and multiplexing the TE polarized component of the multiplexed optical signal may have a power level that is substantially different than the TM polarized component of the optical signal. Such power imbalances in the polarization multiplexed optical signal may cause errors when the signal is detected. In addition, the higher power polarization component may be preferentially amplified during propagation through a chain of optical amplifiers, such that the low power polarization component of the optical signal receives less power at each amplifier and thus suffers from a lower optical signal-to-noise ratio (OSNR).

In one example of this disclosure, an optical device, which may be a passive device, such as an optical coupler, is provided in one optical path carrying a higher power optical signal. Alternatively, the reflector reflectivities may be adjusted such that light output from one side of the laser that experiences more loss is output from a reflector having a lower reflectivity, and thus higher power, than light output from the other side of the laser.

Moreover, it may be desirable to test a photonic integrated circuit ("PIC") before packaging in order to improve a yield of a packaged optical module or system. Accordingly, consistent with a further aspect of this disclosure, implementations for on-chip testing of the tunable lasers and other optical components on the PIC are provided. For example, a "shutter" variable optical attenuator ("SVOA") may be used to transmit a tapped signal for testing in a testing mode, and to block the tapped signal in an operation mode. By incorporating the SVOA in the PIC, there is no need to allocate an additional output port for providing an optical signal for testing. Thus, the PIC may include more devices than would otherwise be provided or have a smaller footprint. In another case, a shutter VOA may be used to allow different amounts of light to transmit through for testing mode and for normal operation. For instance, this may allow sufficient power for rapid wavelength characterization of the laser in test mode, and adequate attenuation to ensure that the laser linewidth is minimized in normal operation over C-band. In another example, an alignment laser may be further be incorporated in the PIC, such that a coupling between the PIC and an external waveguide or optical fiber may be improved. In a further example, a loopback waveguide may be provided on the PIC in order to test fabricated devices before dicing. Accordingly, wafer-level testing may be achieved.

Examples of power balanced lasers will next be described with reference to FIGS. 1, 2a-2e, 3a-3d, 4, and 5a-5f; and various SVOA implementations are described below with reference to FIGS. 6-11.

FIG. 1 illustrates an optical link or optical communication system 100 consistent with an aspect of the present disclosure. Optical communication system 100 includes a plurality of transmitter blocks (Tx Block) 12-1 to 12-n provided in a transmit node 11. Each of transmitter blocks 12-1 to 12-n receives a corresponding one of a plurality of data or information streams Data-1 to Data-n, and, in response to a respective one of these data streams, each of transmitter blocks 12-1 to 12-n may output a group of optical signals or channels to a combiner or multiplexer 14. Each optical signal carries an information stream or data corresponding to each of data streams Data-1 to Data-n. Multiplexer 14, which may include one or more optical filters, for example, combines each of group of optical signals onto optical communication path 16. Optical communication path 16 may include one or more segments of optical fiber and optical amplifiers, for example, to optically amplify or boost the power of the transmitted optical signals.

As further shown in FIG. 1, a receive node 18 is provided that includes an optical splitter or demultiplexer 20, which may include one or more optical filters, for example, optical demultiplexer 20 supplies each group of received optical signals to a corresponding one of receiver blocks (Rx Blocks) 22-1 to 22-n. Each of receiver blocks 22-1 to 22-n, in turn, supplies a corresponding copy of data or information streams Data-1 to Data-n in response to the optical signals. It is understood that each of transmitter blocks 12-1 to 12-n has the same or similar structure and each of receiver blocks 22-1 to 22-n has the same or similar structure. In some implementations, there may be multiple multiplexers and fibers and wavelength selective switches and ROADMs employed in the link.

Figure 2A:
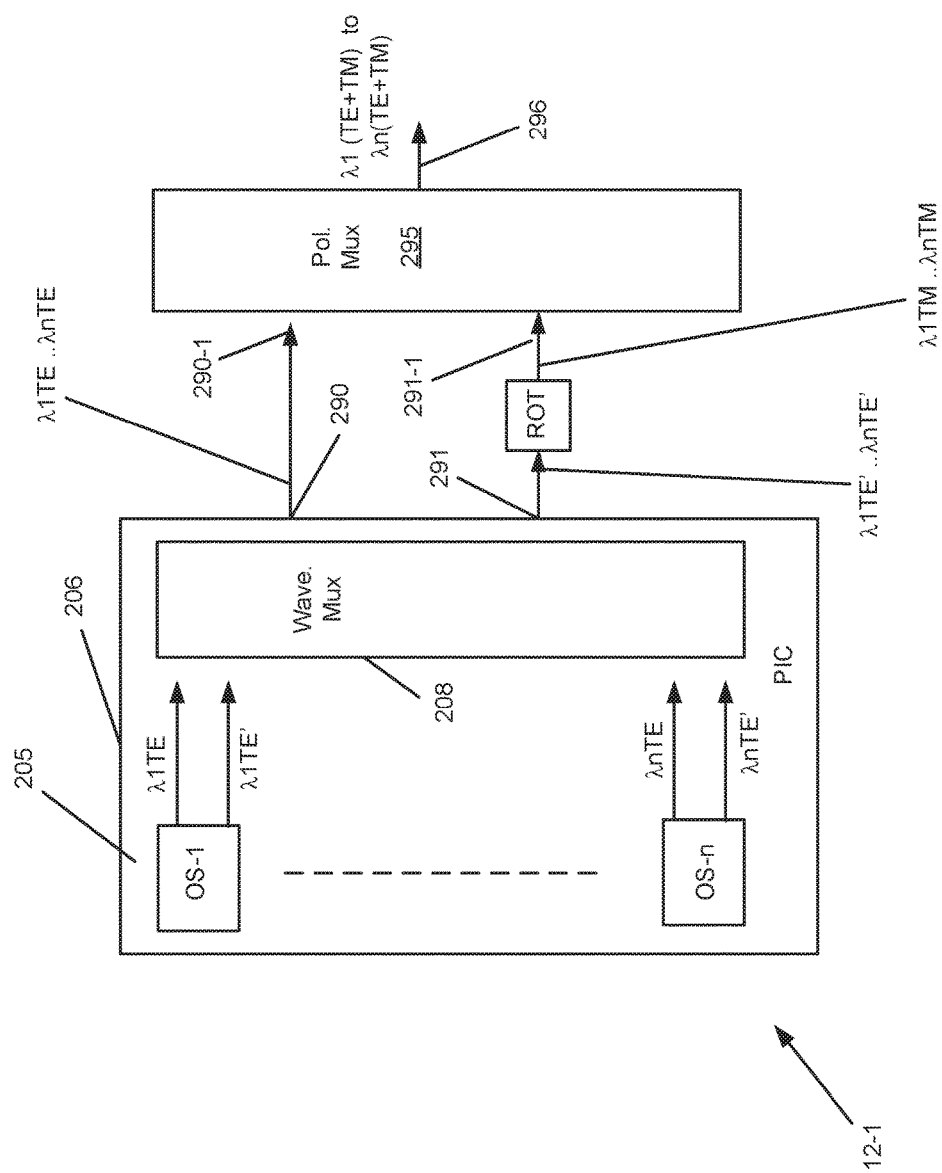
FIG. 2a illustrates an example of transmitter block consistent with an aspect of the present disclosure.

FIG. 2a illustrates one of transmitter blocks 12-1 in greater detail. Transmitter block 12-1 may include circuitry (not shown) that processes each of data streams Data-1 to Data-n and supplies electrical signal (including drive signals) to optical sources or transmitters OS-1 to OS-2. These electrical signals are used to drive modulators in each optical source to provide modulated optical signals corresponding to data streams Data-1 to Data-n. Such modulators are discussed in greater detail below.

In one example, optical sources OS-1 to OS-n are provided on transmit photonic integrated circuit (PIC) 205 provided on a substrate, including for example, a group III-V material, such as indium phosphide, or silicon or other semiconductor or insulative material. As further shown in FIG. 2a, each of optical sources OS-1 to OS-n supplies a corresponding pair of modulated optical signals (for example, a respective one of pairs λ1TE, λ1TE' . . . λnTE, λnTE') to wavelength multiplexing circuitry 208. Typically, each optical signal within a given pair has the same or substantially the same wavelength, e.g., each of optical signals λ1TE, λ1TE' have wavelength λ1. In one example, each of optical signals λ1TE to λnTE are multiplexed by wavelength multiplexing circuitry 208 into a first WDM output 290 and each of optical signals λ1TE' to λnTE' are multiplexed into a second WDM output 291. Wavelength multiplexing circuitry 208 may include one or more optical combiners or arrayed waveguide gratings (AWGs) and/or one or more power combiners. Optical sources OS-1 to OS-10 and wavelength multiplexing circuitry 208 may be provided on substrate 205, for example. Substrate 205 may include indium phosphide or other semiconductor materials.

As further shown in FIG. 2a, the first (290) WDM output (including optical signals λ1TE to λnTE) may be provided to polarization multiplexing circuitry 295, including for example a polarization beam combiner. In one example, each optical signal in first WDM output 290 may have a transverse electric (TE) polarization and is supplied to a polarization beam combiner by polarization maintaining optical fiber 290-1, such that the polarization of each optical signal in the first WDM output has the TE polarization upon input to polarization multiplexing circuitry 295. Each optical signal in WDM output 290 therefore has a TE designation. The second WDM output 291 may also have a TE polarization when output from wavelength multiplexer 208 (and therefore each optical signal λ1TE' to λnTE' in WDM output 291 has a TE'), but the second WDM output 291 may be provided to a second polarization maintaining fiber 291-1 that is twisted in such a way that the polarization of each optical signal in the second WDM output 291 is rotated, for example, by 90 degrees. Alternatively, a rotator 294 may be provided as shown in FIG. 2a to rotate the polarization of each of optical signals λ1TE' to λnTE'. Accordingly, after such rotation, each such optical signal may have a transverse magnetic (TM) polarization when supplied to polarization multiplexing circuitry 295. Polarization multiplexing circuitry 295, in turn, combines the two WDM optical outputs to provide a polarization multiplexed WDM optical signal 296 λ1(TE+TM) to λn(TE+TM).

It is understood, that optical sources OS-1 to OS-10, as well as the wavelength multiplexing circuitry, wavelength multiplexer or wavelength combiner 208, may be provided as discrete components, as opposed to being integrated onto substrate 205. Alternatively, selected components may be provided on a first substrate while others may be provided on one or more additional substrates in a hybrid scheme in which the components are neither integrated onto one substrate nor provided as discrete devices.

Figure 2B:
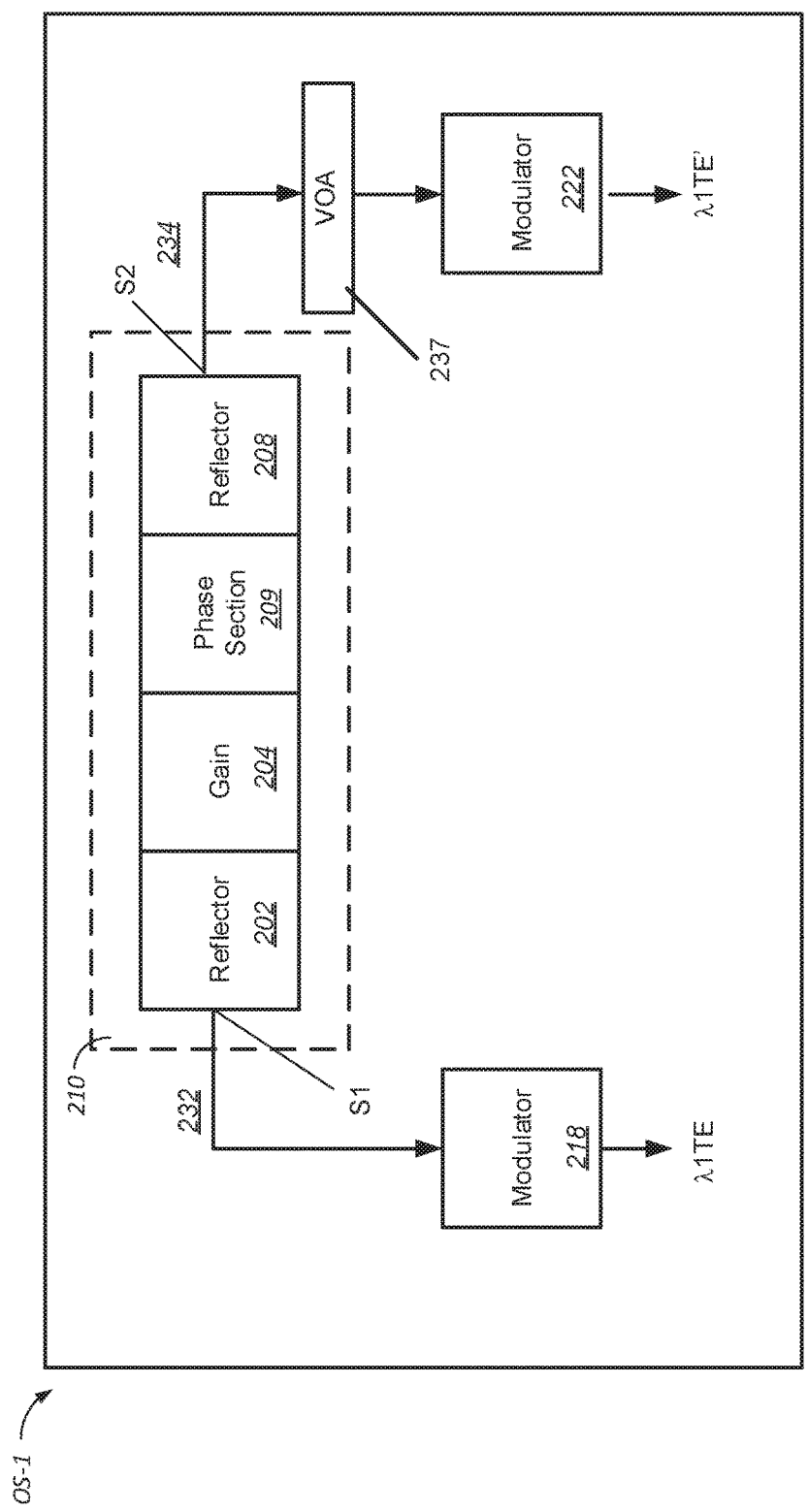
FIGS. 2b-2e show examples of optical sources having balanced output powers consistent with an aspect of the present disclosure.
Figure 2C:
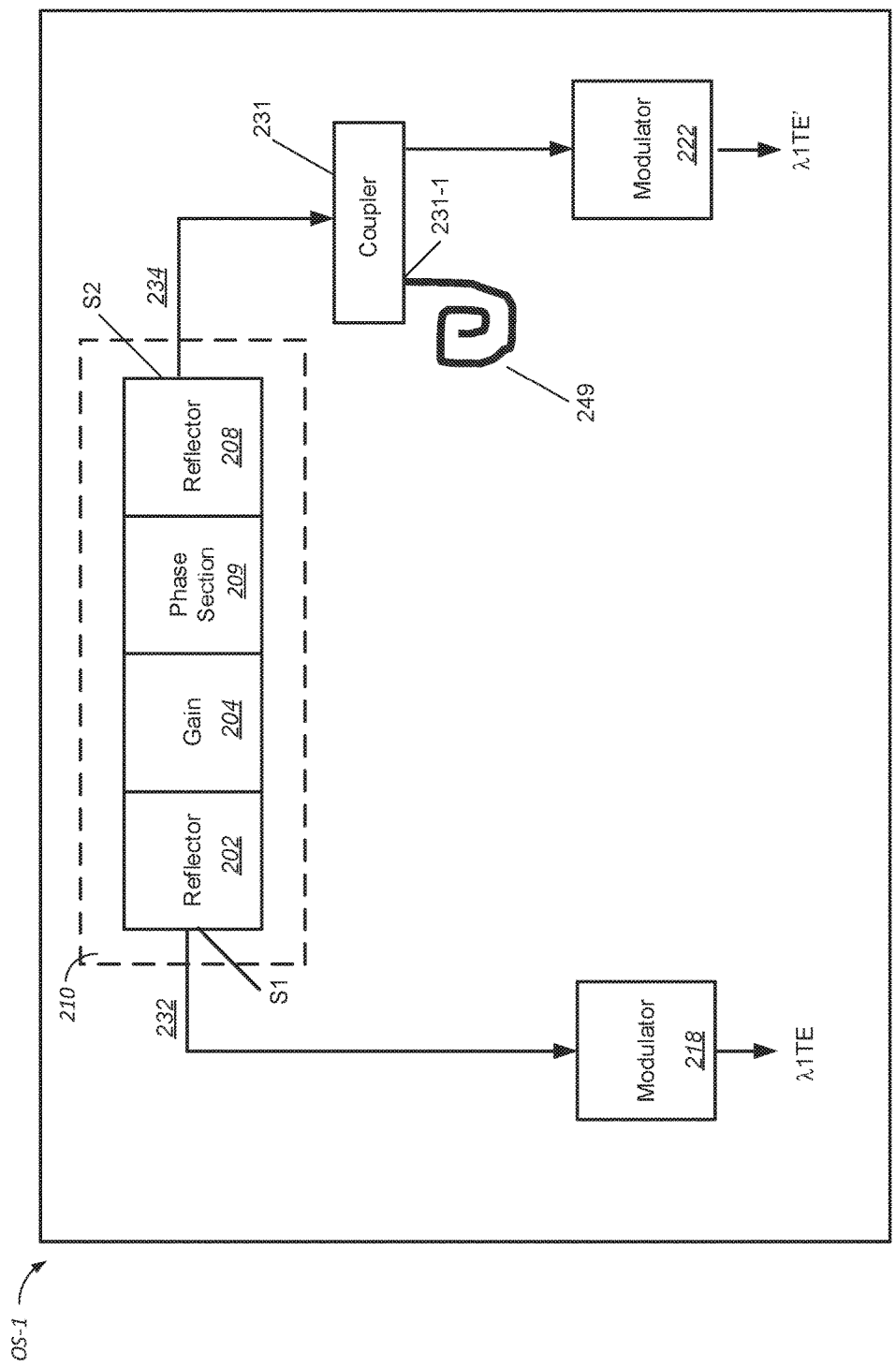

FIG. 2b illustrates an example of optical source OS-1 consistent with an aspect of the present disclosure. It is noted that each of remaining optical sources OS-2 to OS-n shown in FIG. 2a may have the same or similar structure as optical source OS-1 shown in FIG. 2b. Optical source OS-1 has a laser including mirror or reflector sections 202 and 208 that may define a cavity of laser 210. Gain (204) and phase adjusting (209) sections may be provided between reflector sections 202 and 208. Light, e.g., continuous wave (CW) light, 232 may be supplied from side S1 of laser 210 to modulator 218 and CW light 234 may be supplied from side S2 of laser 210 to modulator 222 via variable optical attenuator (VOA) 237. As noted above, the power output from one side, such as side S1, of the semiconductor laser, such as laser 210, may differ from the power of light output from the other side of laser, such as side S2 before or after the modulator. Accordingly, consistent with an aspect of the present disclosure, a variable optical attenuator (VOA) 237 may be provided that receives light output from side S2 of laser 210 to selectively attenuate such light so to be at a desired level. As further noted above, the power of light output from side S2 may be adjusted or power balanced by the VOA 237 to the same or substantially the same as the light output from side S1.

Alternatively, the power of light output from side S2 may be adjusted or power balanced so that such light has the same power at modulator 222 as the power of light output from side S1 at modulator 218 if loss after the modulator is the same. In another example, light propagating from S1 may experience higher design loss than light propagating from S2 due to any combination of a longer waveguide path, a lossier waveguide path, similar or additional optical components with higher insertion loss before and after the modulators, or different optical gain before or after the modulator, and so the loss compensation may balance the entire net loss difference. In another example, the power of the two polarizations for the same wavelength that is transmitted down the fiber (e.g., λ1 (TE+TM) as shown in FIG. 2a) may experience different losses from the laser to the fiber. The loss compensation may balance the entire net loss difference between the two polarizations along the separate optical paths.

VOA 237, however, is typically biased and thus may consume power. Accordingly, consistent with an additional aspect of the present disclosure, VOA 237 may be replaced with a passive device, e.g., one that does not have a current or voltage applied thereto, such as coupler 231 (see FIG. 2c). Coupler 231 may be configured or have a structure such that light output from side S2 of laser 210 may incur a predetermined loss to achieve the power balancing noted above.

Figure 2D:
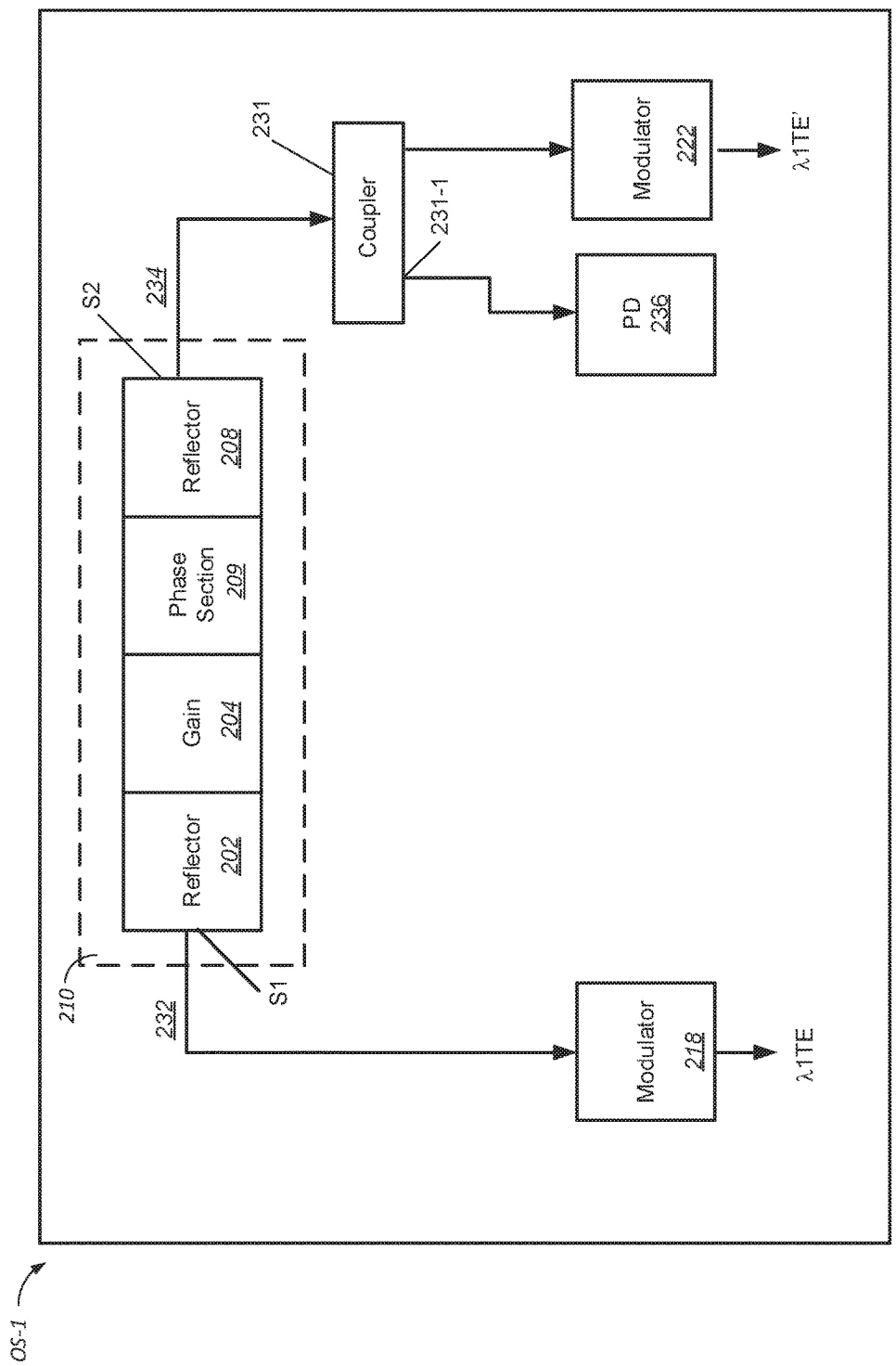
Figure 2E:
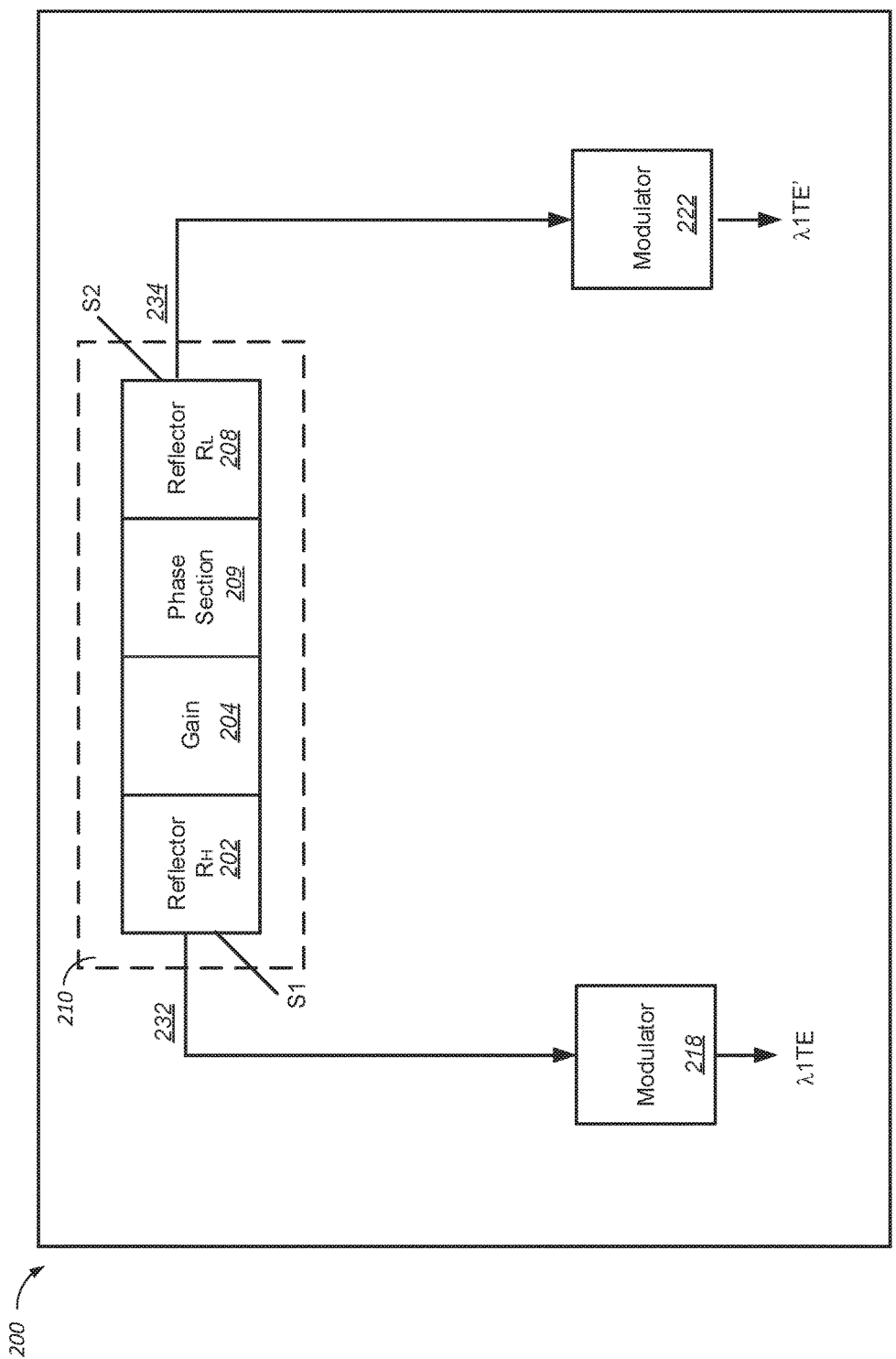

In one example, coupler 231 may be an MMI coupler, which has a port or location 231-1 at which extraneous light may be output. In order to prevent or limit such light from being reflected back to the laser, for example, a low loss or dispersive structure may be provided at such location 231-1. Here, such structure constitute waveguide 249, which may have a spiral shape. Other waveguides shapes and low loss or dispersive structures may be provided. Such structures are described in U.S. Patent Application Publication No. 2014/0185979, the entire contents of which are incorporated herein by reference. Alternatively, a photodiode may be used to absorb the light and the photocurrent may be used to monitor the optical power. Referring to FIG. 2d as an example, light from the port 231-1 is provided to a photodetector 236, where the light is absorbed and photocurrent is generated.

Power balancing consistent with a further aspect of the present disclosure will next be described with reference to FIG. 2d. Here, a device, such as coupler 231, that imparts a predetermined loss in the path of the output light is omitted, and the reflectivities of reflectors 202 and 208 are designed to provide the desired power levels of the light output from sides S1 and S2. For example, the reflectivity of reflector 202 may be adjusted to be relatively high, so that less light or light 232 with less power is output from side S1. On the other hand, reflector 208 may be designed to have a relatively low reflectivity, such that light 234 output from side S2 has more power. As a result, if the loss encountered by light output from side S2 along a path to modulator 222, for example, is greater than the loss encountered by light output from side S1 along a path to or after modulator 218, the power adjustment noted above may insure that that such light supplied to modulators 218 and 222 or after the modulators is the same or substantially the same.

Figure 3B:
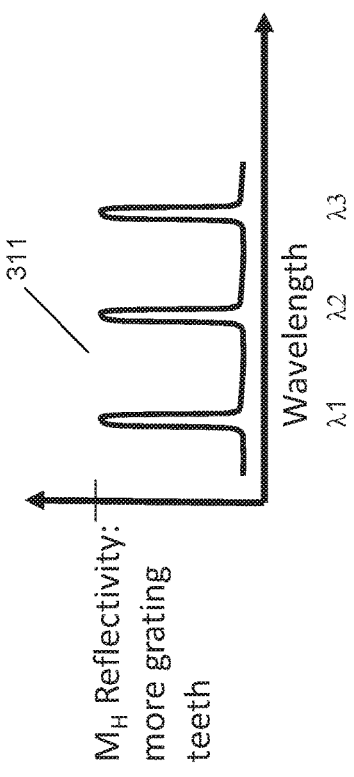
FIGS. 3a-3d show examples of granting teeth and corresponding reflectivity characteristics consistent with an additional aspect of the present disclosure.
Figure 3D:
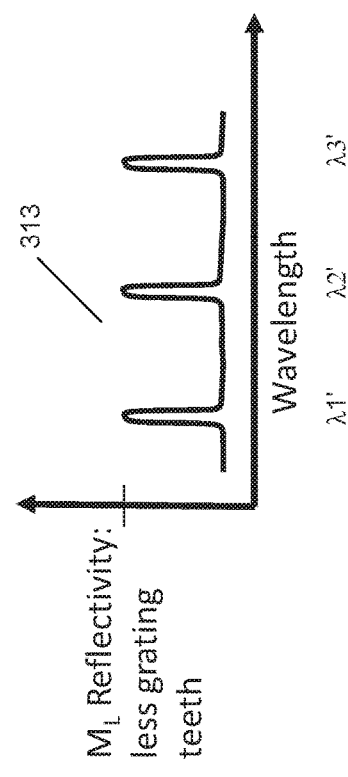
Figure 3A:
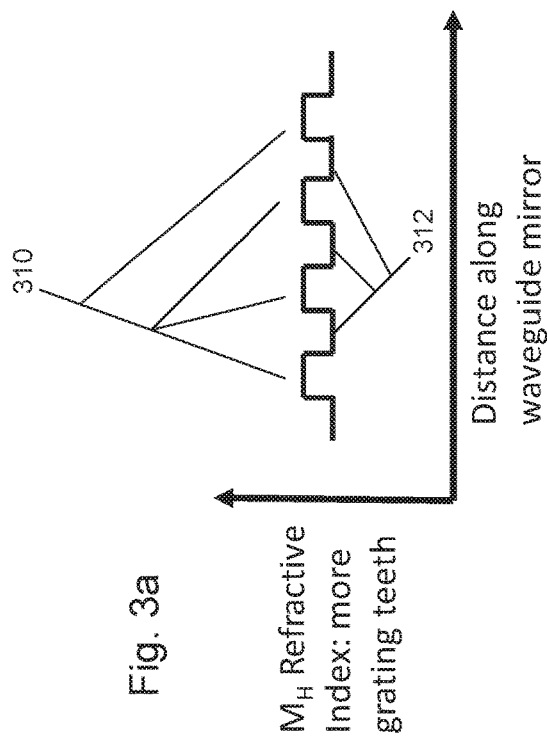
Figure 3C:
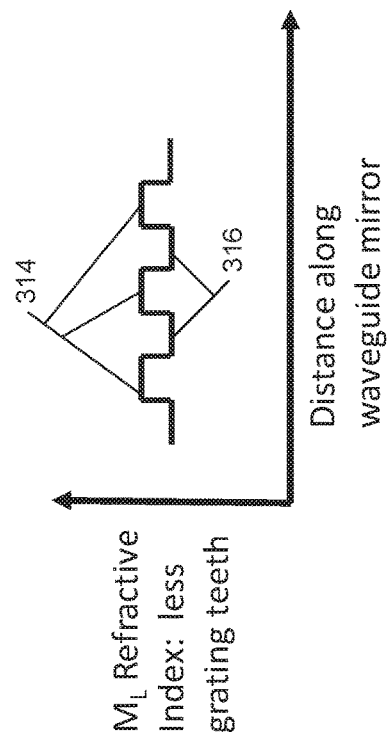

Reflectively adjustment will next be described with reference to FIGS. 3a-3d. As noted above, the reflector or mirror sections of the laser, such as mirror section 202 and 208 may include a plurality of refractive index variations which collectively constitute a grating in each mirror section. Such refractive index variations in mirror section 202 are shown in FIG. 3a as a plurality of grating "teeth" or high refractive portions 310 spaced from each other by low refractive index portions 312. As shown in FIG. 3b, such refractive index variations yield a reflectivity characteristic of reflector section 202 having a series of peaks, each at a respective wavelength (λ1, λ2, λ3), and each having a maximum reflectivity $M_H$. Reflector section 208, on the other hand, has a fewer teeth or high refractive index portions 314 spaced from each other by low refractive index portions 316 (see FIG. 3c). The resulting reflectivity characteristic 313 shown in FIG. 3d also has reflectivity peaks, but such peaks are at different wavelengths (λ1', λ2', λ3'). Moreover, the peaks in FIG. 3d have a lower maximum reflectivity ($M_L$) than that of the peaks shown in FIG. 3b. That is, by forming reflector section 208 with fewer refractive index teeth than reflector section 202, the reflectivity of section 208 at wavelengths λ1', λ2', λ3' is less than the reflectivity of section 202 at wavelengths λ1', λ2', λ3'. Accordingly, the reflectivity of the reflector sections of laser 210 can be in part controlled based on the number of refractive index teeth.

Returning to FIG. 1, a multiplexed optical signal is transmitted to a receive node 18, which includes a demultiplexer 20. Demultiplexer 20 outputs groups of optical signals that make up the multiplexed signal, such that each group is provided to a corresponding one of receiver blocks receiver (Rx) blocks 22-1 to 22-n. One such receiver block, Rx block 22-1 will next be described with reference to FIG. 4. It is understood that remaining receiver blocks 22-2 to 22-n have the same or similar construction as receiver block 22-1.

Figure 4:
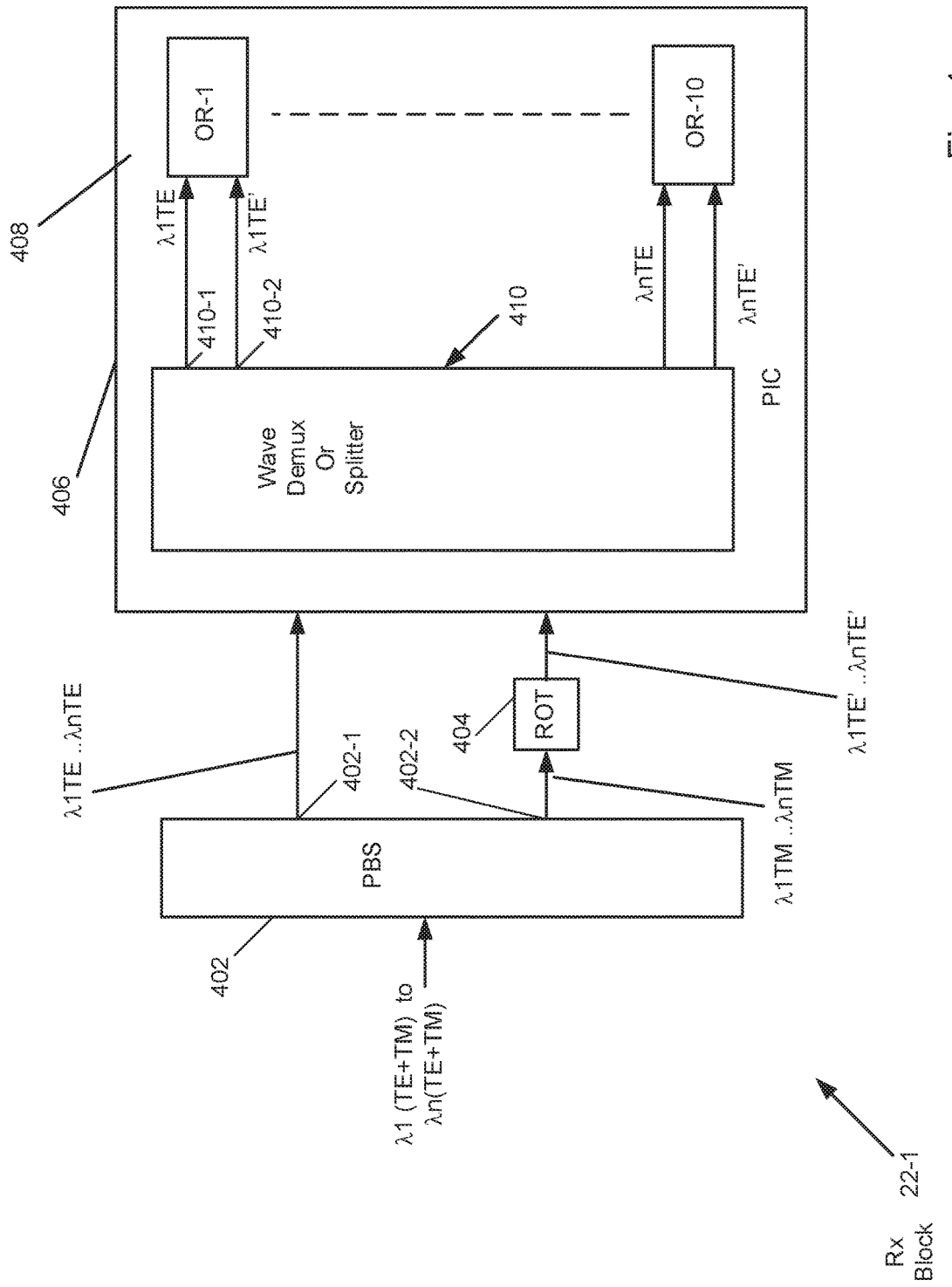
FIG. 4 shows a block diagram of an example receiver consistent with the present disclosure.

Referring to FIG. 4, Rx block 22-1 may include a polarization beam splitter (PBS) 402 that receives polarization multiplexed optical signals λ1(TE+TM) to λn(TE+TM) from demultiplexer 20 and provides optical signals λ1TE to λnTE having a TE polarization at a first output 402-1 and optical signals λ1TM to λnTM having a TM polarization at a second output 402-2. Optical signals λ1TM to λnTM may be fed to a polarization rotator 404 that rotates the polarization of each such optical signal from the TM polarization to the TE polarization. Such polarization rotated signals are therefore designated λ1TE' to λnTE' in the drawings.

As further shown in FIG. 4, optical signals λ1TE to λnTE and λ1TE' to λnTE' are next provided to wavelength demultiplexer or splitter circuit 410, which outputs pairs of optical signals, such that each optical signal in each such pair has the same wavelength. Accordingly, for example, wavelength demutiplexing or splitter circuit 410 supplies optical signals λ1TE and λ1TE' at a respective one of outputs 410-1, 410-2. Each optical signal pair, in turn, is provided to a corresponding one of optical receiver circuits OR-1 to OR-n. Optical receiver circuits OR-1 to OR-n and wavelength demultiplexer 490 may be integrated in PIC 408 on substrate 406. Alternatively, wavelength demultiplexer 490 and optical receiver circuits may be provided as discrete components or on separate substrates.

One of optical receiver circuits, OR-1, will next be described with reference to FIGS. 5a-5h. It is understood that each of remaining optical receiver circuits OR-2 to OR-n have the same or similar structure as optical receiver circuit OR-1.

Figure 5A:
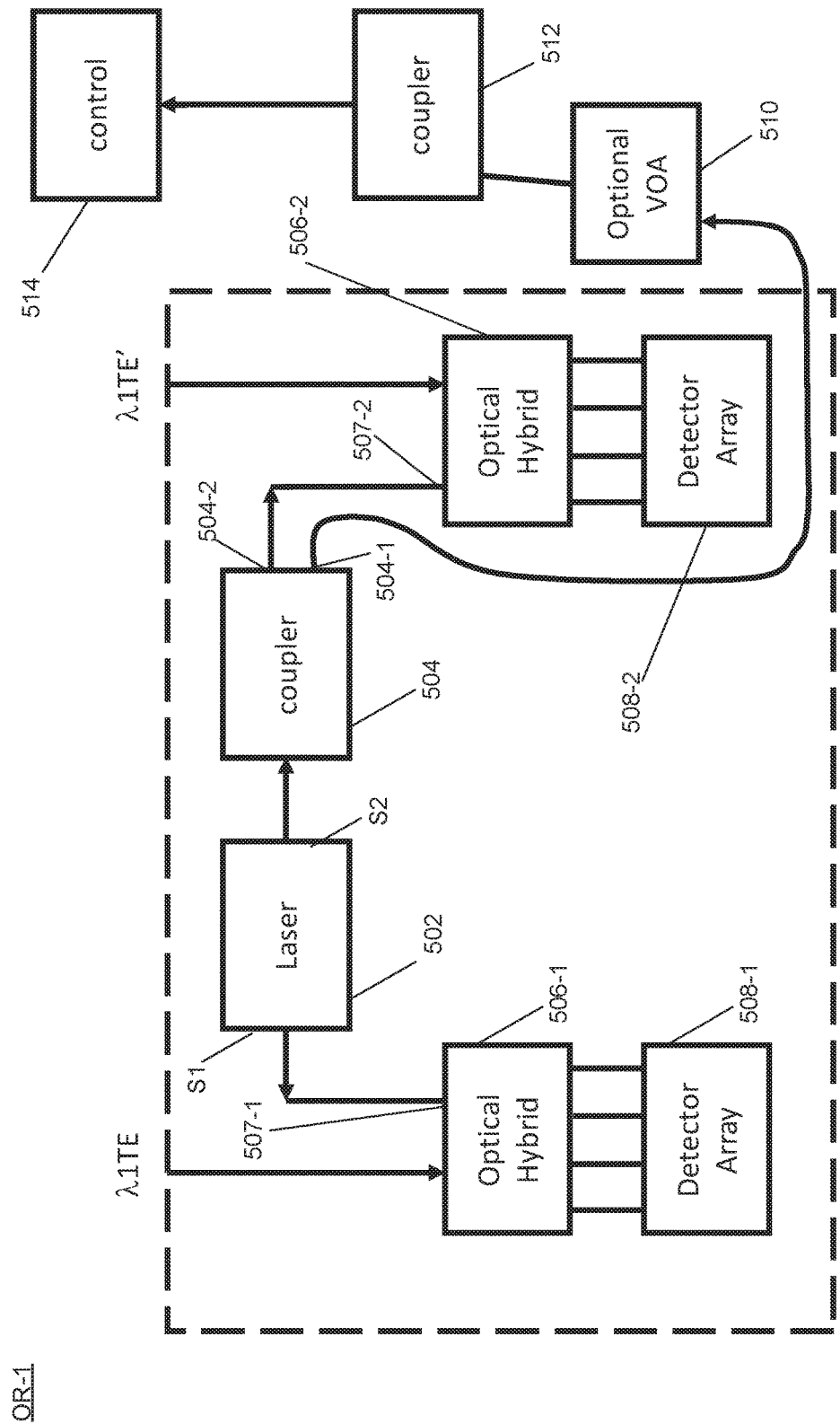
FIGS. 5a-5h show examples of optical receiver circuits consistent with additional aspects of the present disclosure.

Consistent with an aspect of the present disclosure, optical signals λ1TE and λ1TE', as well as optical signals λ2TE to λnTE and λ2TE' to λnTE' may be modulated, for example, in accordance with a phase modulation format, such as BPSK, QPSK, higher-order QAM or another phase modulation format. Accordingly, coherent detection may be employed in order to appropriately sense and extract the data carried by these optical signals. FIG. 5a shows an example of optical receiver circuit OR-1, which may be suitable to carry out coherent detection consistent with an aspect of the present disclosure.

In particular, as further shown in FIG. 5a, OR-1 may include a local oscillator ("LO") laser 502, first and second photodiode arrays 508-1 and 508-2, and a control 514. The LO laser 502 is similar to or the same as laser 210 described above with reference to FIGS. 2b-2d but is configured to generate light having a reference wavelength. For example, laser 502 may also have first and second reflector sections, a gain section, and a phase adjusting section. In addition, as discussed in greater detail below, the reflector sections of laser 502 may have different reflectivity in order to achieve power balancing in a manner similar to or the same as that described above in regard to laser 210.

In general, light output from side S1 of LO laser 502 is mixed with incoming optical signal λ1TE in optical hybrid 506-1 to generate one or more mixed AC output signals or mixing products, which are then supplied by optical hybrid circuit 506-1 to photodetector or photodiode array 508-1. Photodetector array 508-1 may detect an AC signal in the mixing products to generate an AC photocurrent that may be further processed to recover data carried by optical signal λ1TE. Similarly, light output from side S2 of laser 502 may be mixed with optical signal λ1TE' in optical hybrid circuit 506-2 to provide mixing products, which are fed to photodetector or photodiode array 508-2. Photodetector array 508-2 may detect an AC signal in the mixing products supplied thereto to generate an AC photocurrent that may also be further processed to recover data carried by optical signal λ1TE'.

Preferably, the AC photocurrent generated by photodetector array 508-1 is the same or substantially the same as the AC photocurrent generated by photodetector array 508-2. Such AC photocurrent may be defined as:

$$AC\ Iph = \sqrt{Iph,signal \cdot Iph,LO},$$

where "AC Iph" is the generated AC photocurrent, "Iph, signa" is the signal power of optical signal λ1TE or λ1TE', and "Iph, LO" is the signal power of light from either side S1 or S2 of laser 502. Differences in AC photocurrent generated by photodetector arrays 508-1 and 508-2 may be minimized if the power of light output from side S1, when such light reaches input 507-1 of optical hybrid 506-1 compensates different AC signal power level from the two photodiode arrays 508-1 and 508-2. That is, the AC powers of such mixed optical power from optical hybrids 506-1 and 506-2 are balanced.

As further shown in FIG. 5a, coupler 504 is provided for monitoring of LO light output from laser 502. Namely, coupler 504 has an output 504-1 that provides a power split portion of the light output from side S2 to an optionally provided VOA 510, which may adjust the power of or block such power split portion. If power is adjusted, the split portion of the light output from coupler output 504-1 may be supplied to an additional coupler 512, which, in turn, directs such light to control circuit 514. Etalons, delay line interferometers, photodiodes and other components in control circuit 514 may be used to monitor LO light output from laser 502 to insure that such light is locked to a particular wavelength or narrow wavelength band, or that it has a power that is at a desired level, for examples.

Figure 5B:
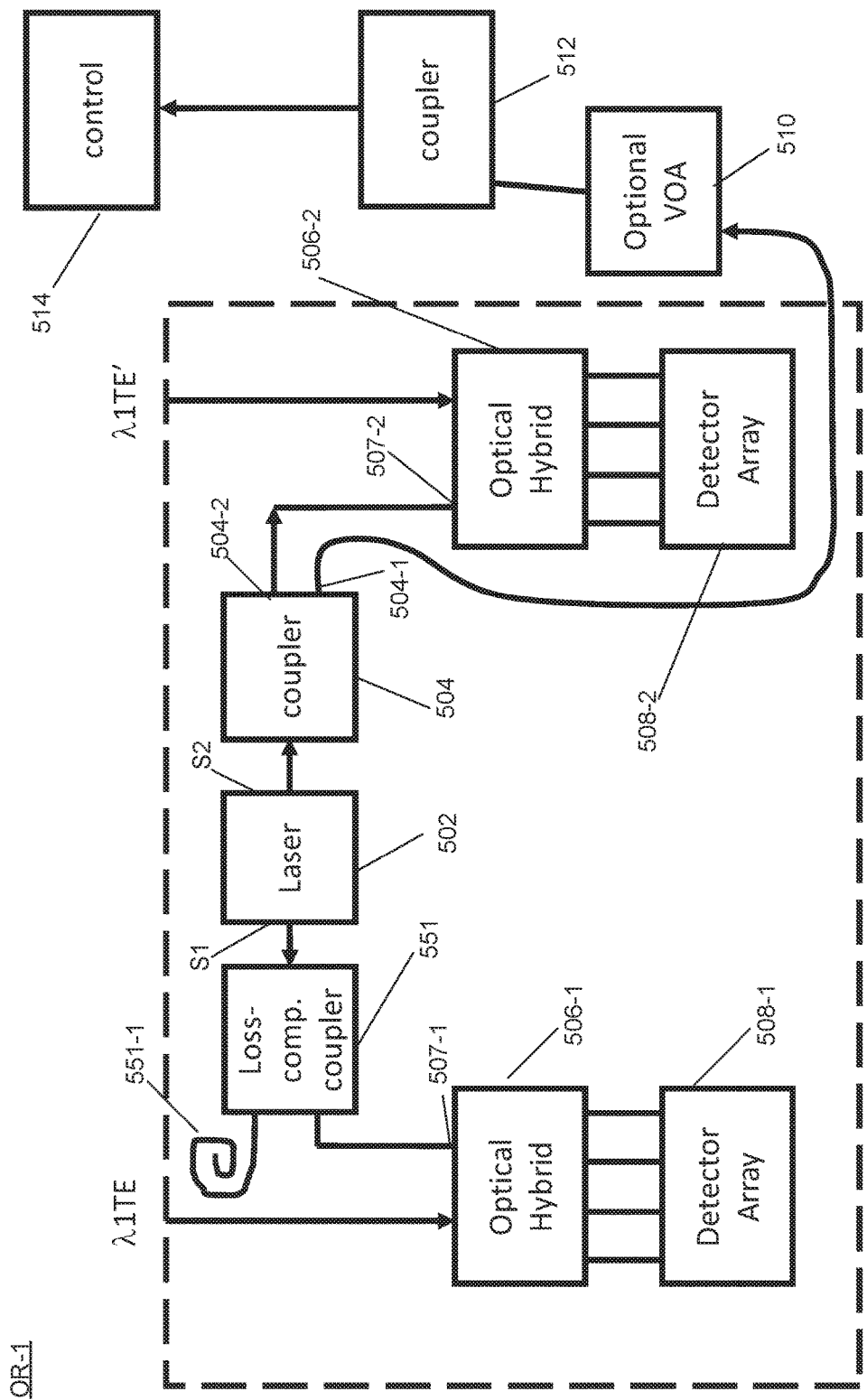

The second power split portion of light output from side S2 is fed to input 507-2 of optical hybrid 506-2. Such second power split portion, however, may have a power that is less than the power of light output from side S1 and fed to optical hybrid input 507-1. Referring to FIG. 5b, in order to balance of the power of the LO light supplied to inputs 507-1 and 507-2, optical receiver circuit OR-1 includes a loss compensating coupler 551 having a predetermined loss so that light passing through such coupler at optical hybrid input 507-1 may have the same or substantially the same power as light at input 507-2 (see FIG. 5b). Coupler 551 may be the same or similar to coupler 231 discussed above in regard to FIG. 2c. Further, coupler 551, like coupler 231 discussed above, may have a low loss or dispersive structure, such as waveguide 551-1, which is similar to and operates in a similar fashion as waveguide 249 discussed above. Alternatively, as shown in FIG. 5g, the waveguide 551-1 may be replaced with an absorptive termination or a power-monitoring photodiode 561-1 instead for example.

Figure 5C:
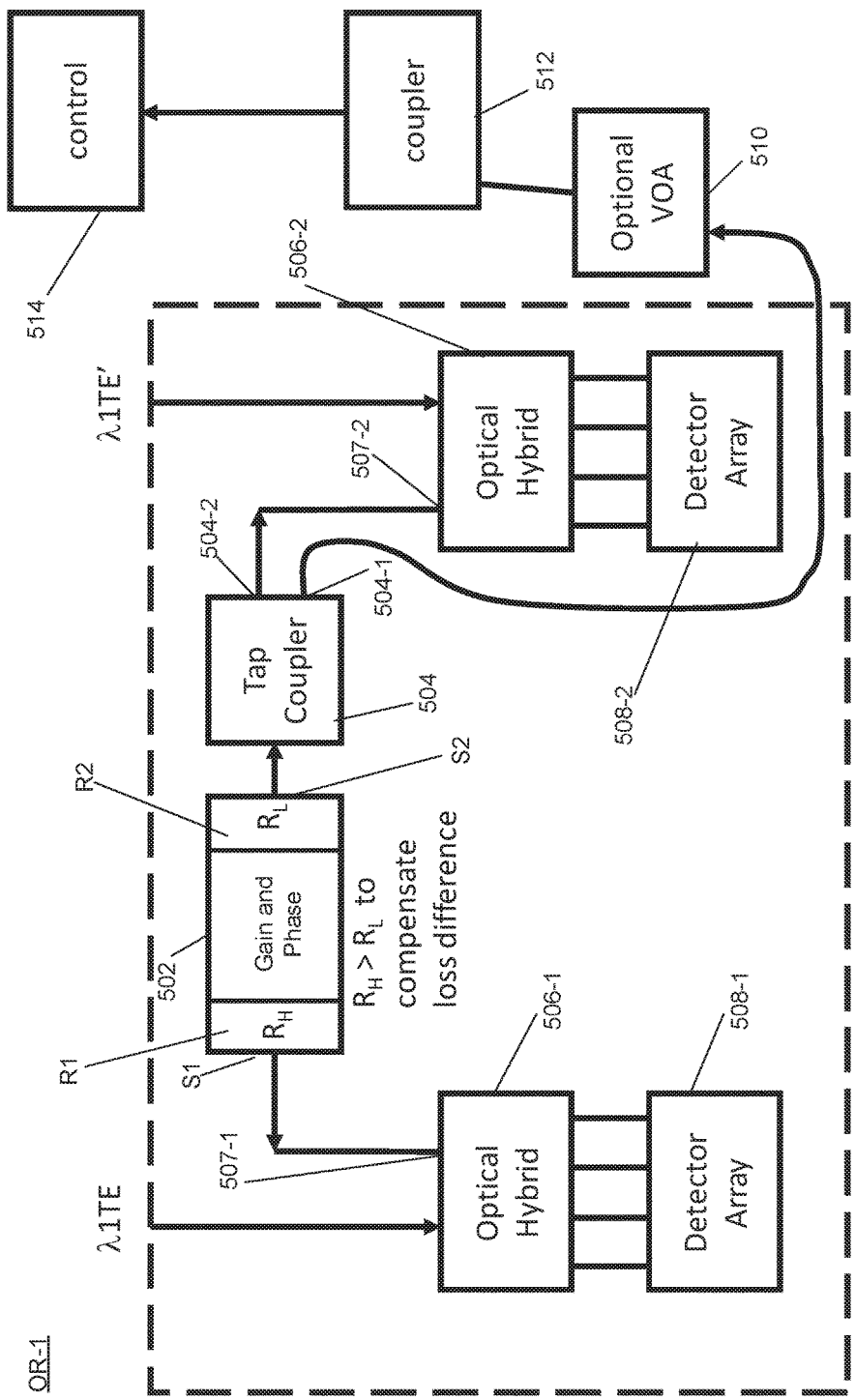

In the example shown in FIG. 5c, coupler 551 is omitted. However, reflector section R1 adjacent side S1 of laser 502 is configured to have higher reflectivity $R_H$ (more refractive index or grating "teeth"), and reflector section R2 adjacent side S2 is configured to have lower reflectivity $R_L$ (fewer grating teeth). As a result, LO light output from side S2 has more power than that output from side S1. The higher power associated with light output from side S2 may offset the loss such light incurs from coupler or tap coupler 504. Accordingly, LO light output from coupler 504 has the same or substantially the same power at optical hybrid input 507-2 as light output from side S1, when such S1 outputted light reaches optical hybrid input 507-1.

Figure 5D:
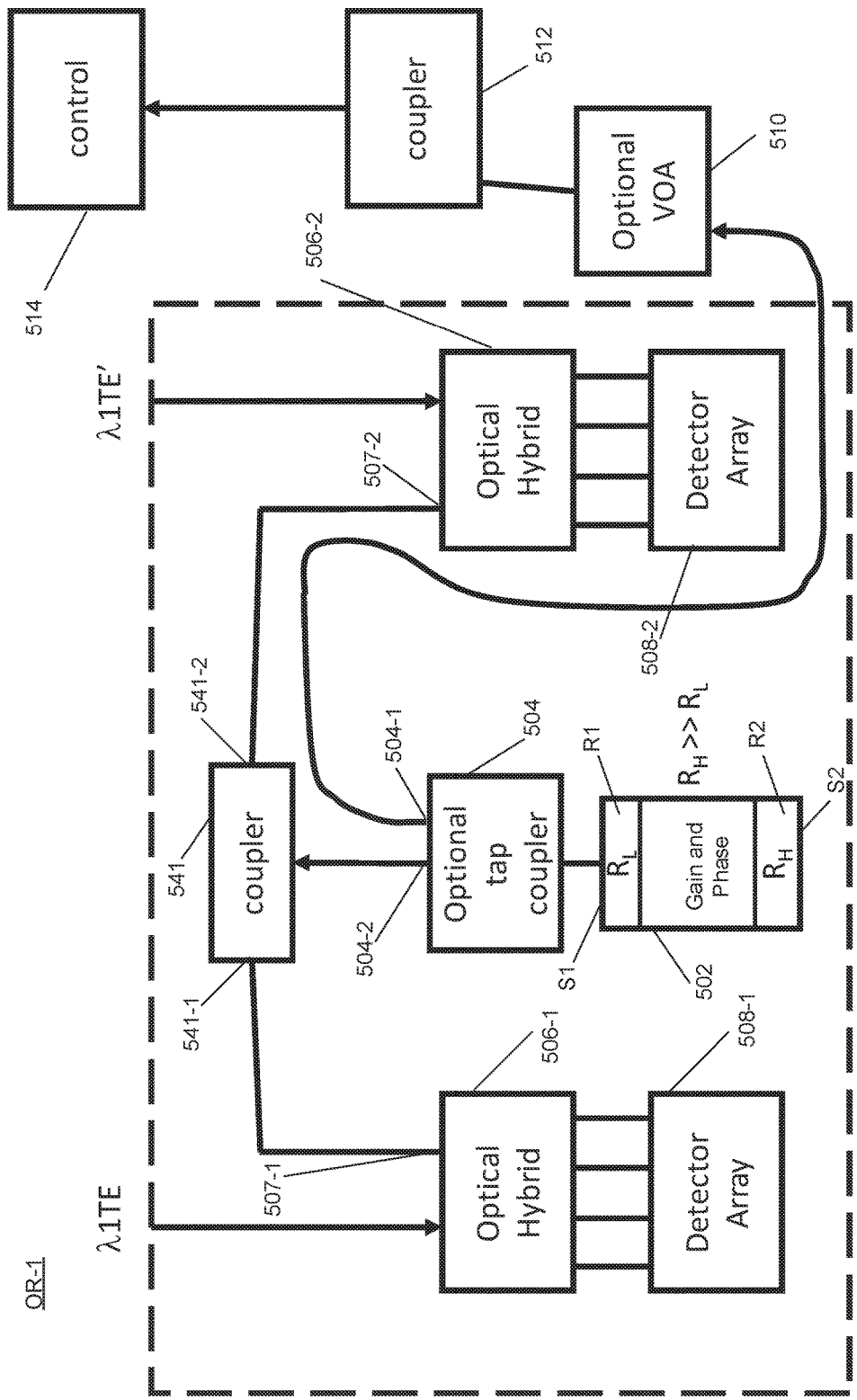

FIG. 5d shows another example of optical receiver circuit OR-1 in which reflector section R1 of laser 502 adjacent side S1 has a reflectivity $R_L$ that is significantly less than the reflectivity $R_H$ of reflector section R2. In this example, little if any LO light is output from side S2, such that all of substantially all the LO light generated by laser 502 is output from side S1. Alternately, light from S2 may be terminated with a dispersive or absorptive element such as a photodiode that may also monitor optical power, as shown in FIG. 5h. Referring back to FIG. 5d, light from S1 may be supplied to an optional coupler 504 having first and second outputs 504-1, 504-2. LO light supplied from output 504-1 may be provided to VOA 510 for monitoring purposes, as noted above. However, LO light supplied from output 504-2 may be provided to coupler 541. In one example, coupler 541 is a 3 dB coupler that supplies a first portion (50%) of the received light at output 541-1 and a second portion (50%) of the received light at output 541-2. As such, the light supplied from both outputs 541-1, 541-2 may be the same or balanced. As further shown in FIG. 5d, LO light supplied from output 541-1 is fed to optical hybrid input 507-1 of optical hybrid 506-1 for mixing with optical signal λ1TE, and LO light supplied from output 541-2 is fed to optical hybrid input 507-2 of optical hybrid 506-2 for mixing with optical signal λ1TE'.

Figure 5E:
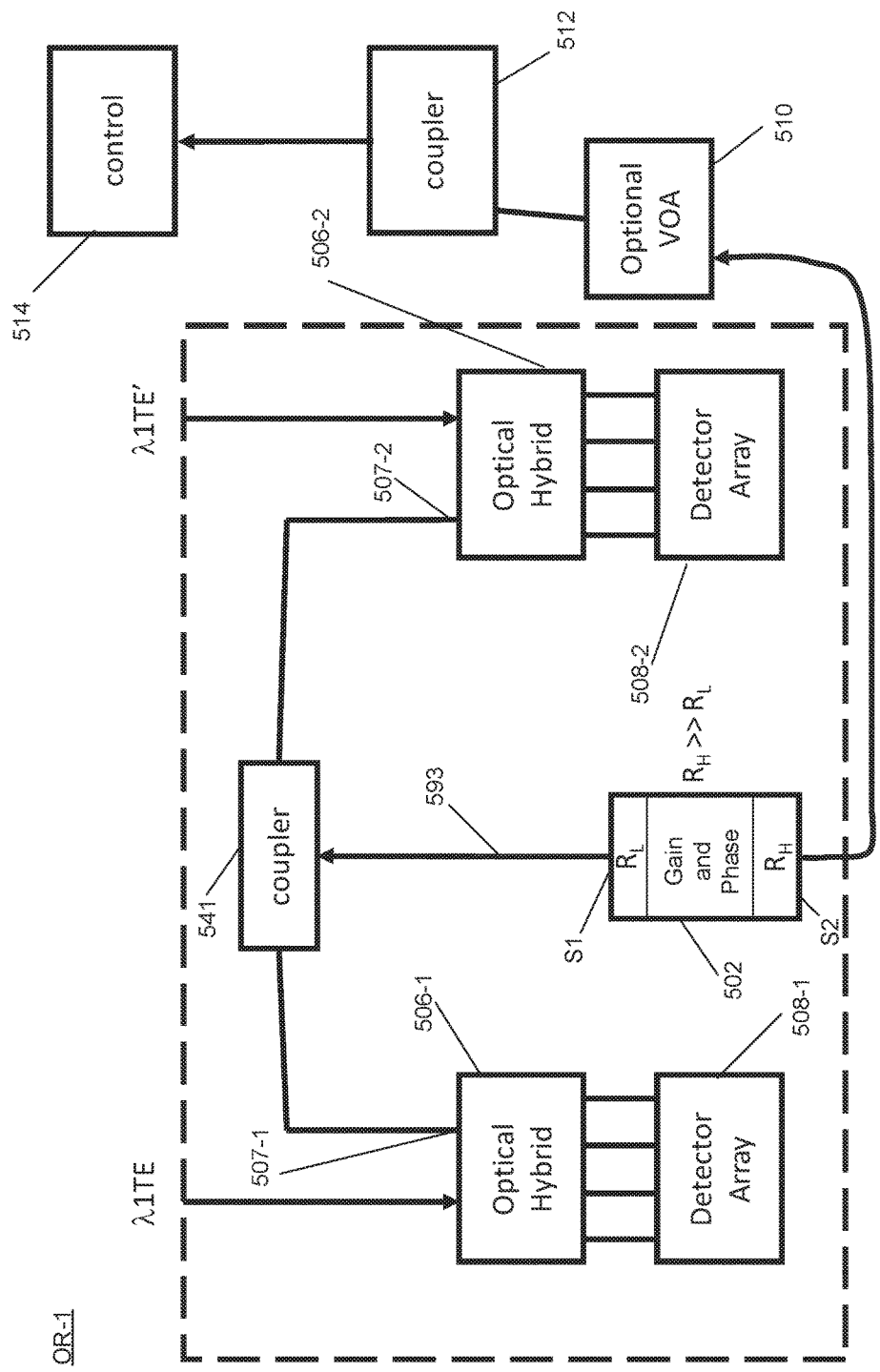

Optical receiver circuit OR-1 shown in FIG. 5e is similar to that shown in FIG. 5d, with the exception that coupler 504 is omitted and light output from side S1 of laser 502 is fed directly to coupler 541 via waveguide 593.

Figure 5F:
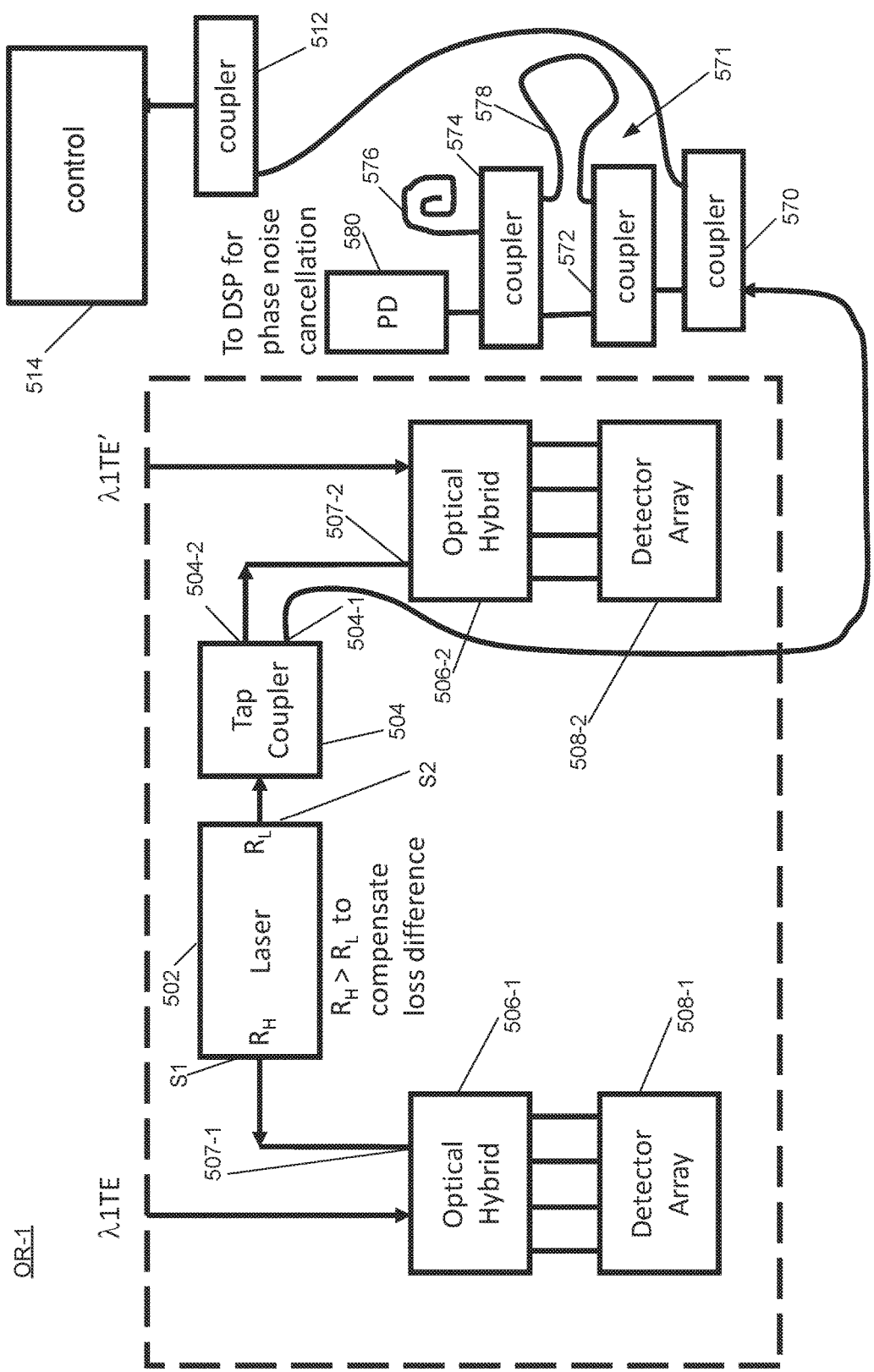
Figure 5G:
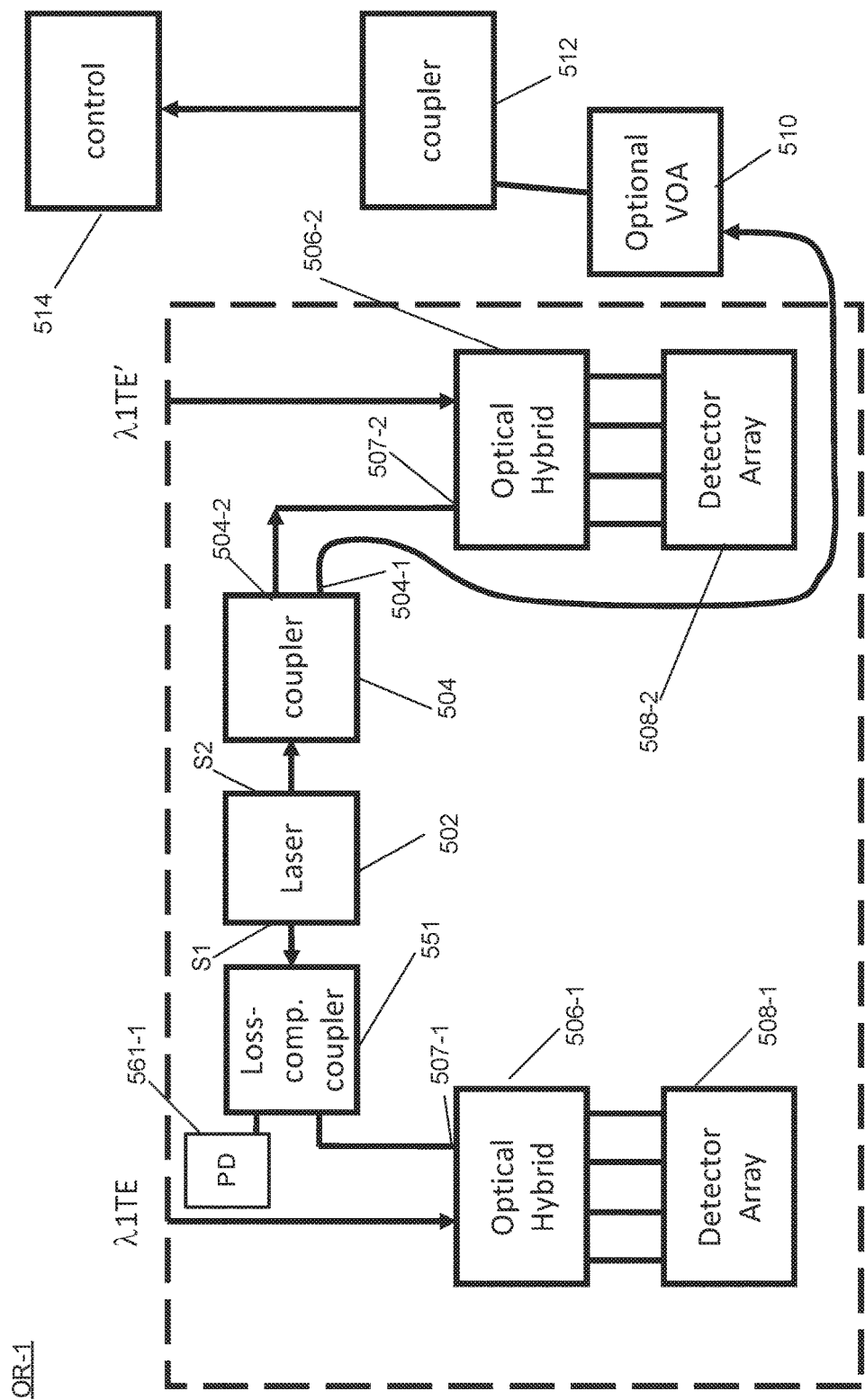
Figure 5H:
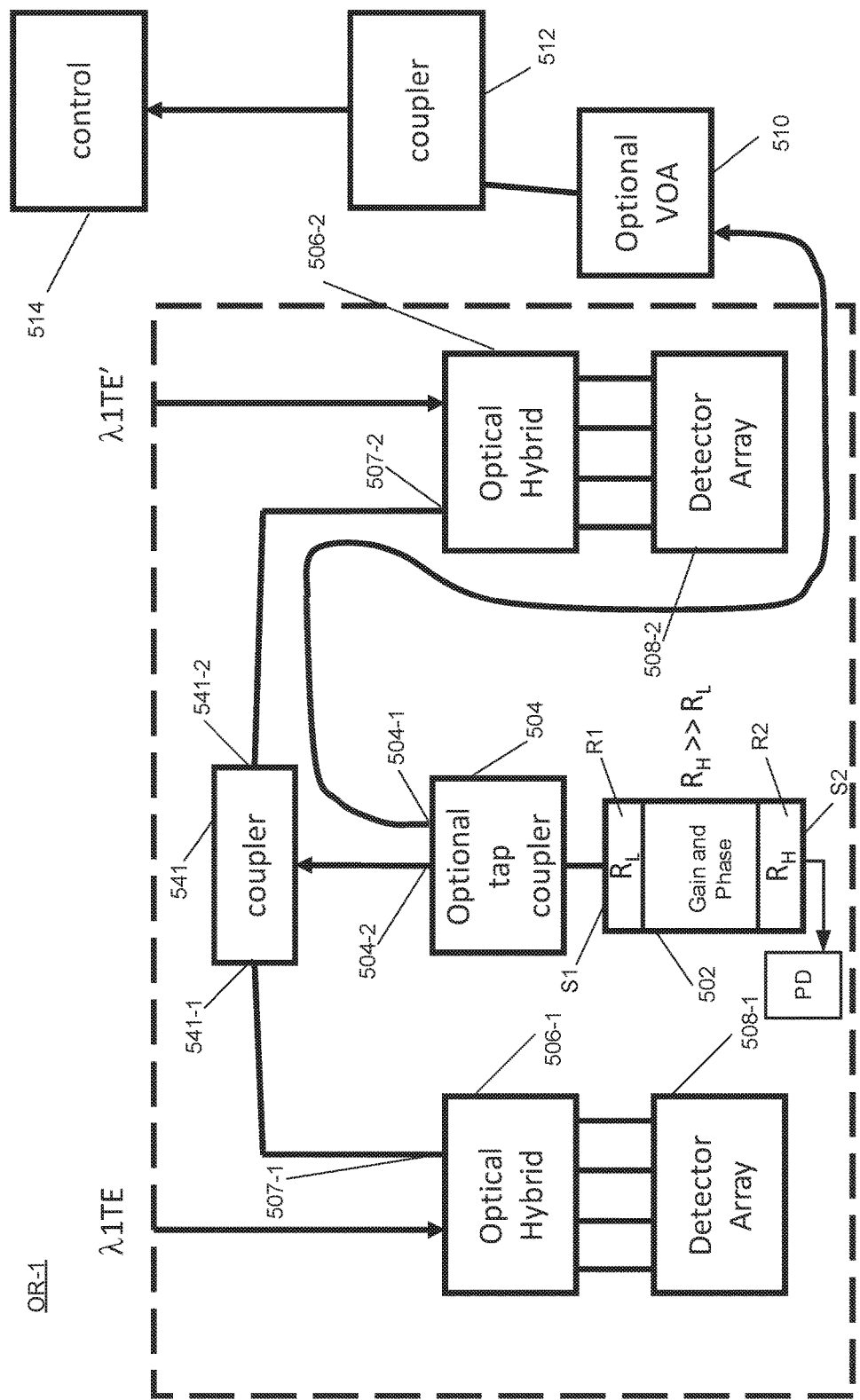

FIG. 5f shows an example of optical receiver circuit OR-1 having a configuration similar to that shown in FIG. 5c. In FIG. 5f, however, coupler output 504-1 feeds a power split portion of light output from side S2 of laser 502 to coupler 570, which supplies a first part of the power split portion of light to coupler 512, which, in turn, feeds such light to control circuit 514 for monitoring and control purposes. The second part of the power split portion is supplied to coupler 572, which, along with coupler 574 and waveguide 578 constitute a delay line interferometer (DLI) 571, such that an output of coupler 574 may be fed to photodiode 580. Photodiode 580 may be a 1-2 bandwidth GHz photodiode (or a higher bandwidth photodiode with appropriate electronic filtering) that supplies an electrical signal characteristic of the phase noise from the local oscillator 502. The electrical output may then be supplied to a digital signal processor (DSP) which, based on the electrical output, may cancel through signal processing the effects of phase noise in the LO light that may be present in the outputs of photodetector arrays 508-1 and 508-2 (also coupled to the DSP). As a result, the optical signal-to-noise ratio (OSNR) associated with the received optical signals, e.g., λ1TE, may be improved by 3-4 dB, for example. Such improved OSNR may be realized with optical signals modulated in accordance with a 64 QAM modulation format and transmitted over conventional optical fiber. In one example, DLI 571 may be provided as part of PIC 406 on substrate 408 (see FIG. 4).

As further shown in FIG. 5f, a low loss or dispersive structure may be provided at an output of coupler 574, which may be an MMI coupler. Such low loss or dispersive structure may constitute waveguide 576, which may be the same or similar to waveguides 249 and 551-1 discussed above.

Various power balancing techniques are discussed above to provide the same or substantially the same optical power to devices in both a transmitter and a coherent receiver. Consistent with a further aspect of the present disclosure, the light output from a laser may be characterized or tested using a "shutter" VOA, as discussed in greater detail below with respect to FIGS. 6-11. Generally, the examples shown in FIGS. 6-11 enable a characterization of a laser output from the LO laser using a single path on a PIC.

Figure 6:
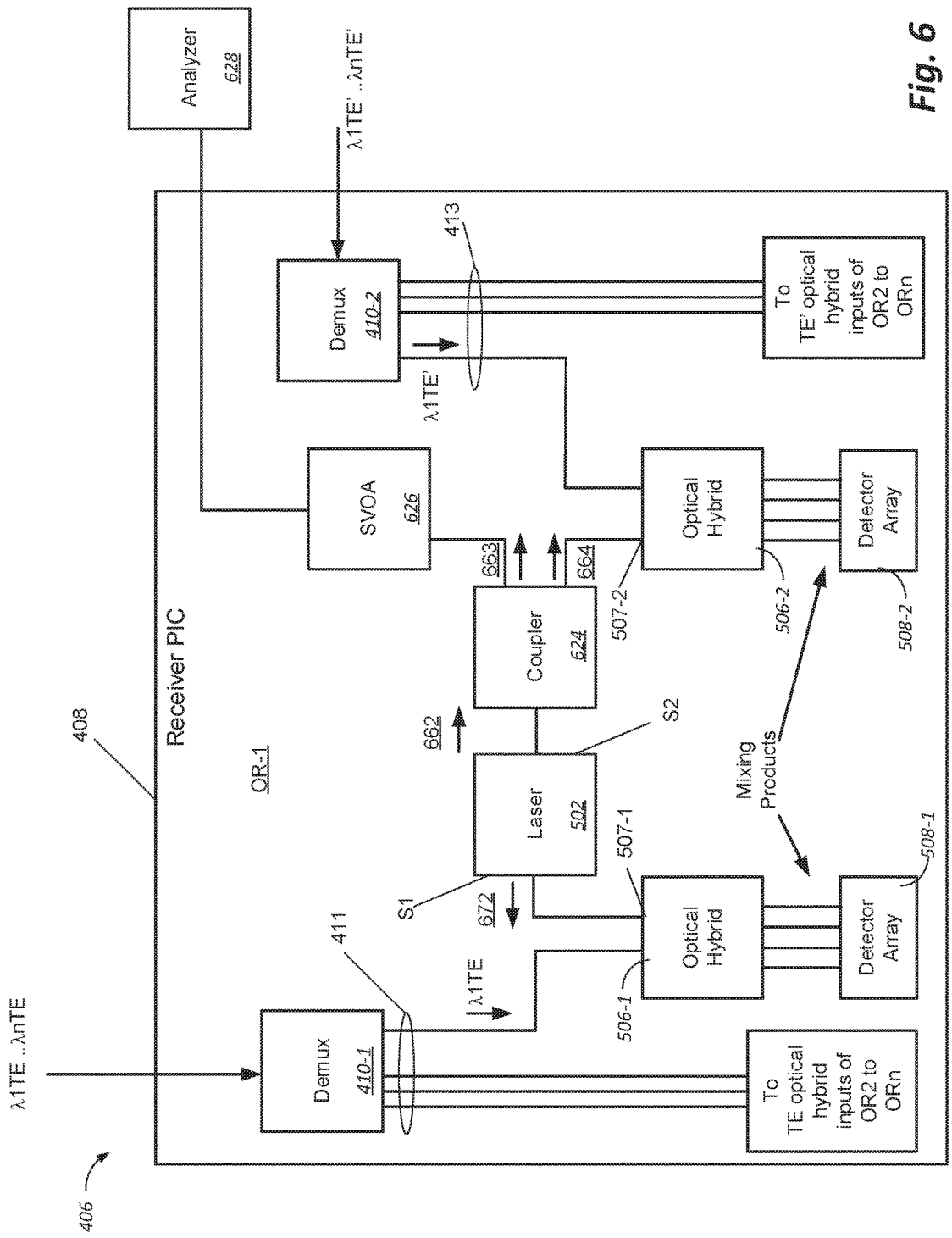
FIGS. 6-7 shows a block diagram of an example optical receiver circuit having a shutter variable optical attenuator.

FIG. 6 shows an example of a PIC 408 provided on substrate 406 (see FIG. 4). As noted above, PIC 408 may include optical demultiplexer circuitry. Such circuitry is shown in FIG. 6 including a first splitter or optical demultiplexer 410-1, including a first arrayed waveguide grating, for example, and a second splitter or optical demultiplexer 410-2, including a second arrayed waveguide grating, for example. As further noted above, optical signals λ1TE . . . λnTE are supplied to demultiplexer circuitry 410 from a first output of PBS 402 and optical signals λ1TE' . . . λnTE' are output from polarization rotator 404, for example. Here, optical signals λ1TE . . . λnTE are input to splitter or demultiplexer 410-1 and optical signals λ1TE' . . . λnTE' are input to splitter or demultiplexer 410-2. Demultiplexer 410-1 has a plurality of outputs 411, one of which supplies optical signal λ1TE to optical hybrid 506-1, and each of the remaining optical signals optical signals λ2TE . . . λnTE is provided to a respective first optical hybrid input of each of optical receivers OR2 to ORn. Similarly, demultiplexer 410-2 has a plurality of outputs 413, one of which supplies optical signal λ1TE' to optical hybrid 506-2, and each of the remaining optical signals optical signals λ2TE . . . λnTE is provided to a respective first optical hybrid input of each of optical receivers OR2 to ORn.

As further shown in FIG. 6, OR-1 may include LO laser 502, as in FIGS. 5a to 5f described above. Laser 502 supplies first LO light 672 to input 507-1 and second LO light 662 to coupler 624. Coupler 624 may be a 10/90 tap that provides a first portion 663 of LO light of LO light to SVOA 626 and a second portion 664 of LO light to input 507-2 of optical hybrid 506-2. In a manner similar to that discussed above, LO light supplied from laser 502 may be mixed in optical hybrids 506-1 and 506-2 and the resulting mixing products may be provided to respective photodetector arrays 508-1 and 508-2.

PIC 408 shown in FIG. 6 may be operated in first and second modes. In the first or test mode, laser 622 is powered on and SVOA 626 is biased to be "open", such that SVOA 626 is substantially or entirely transmissive or even supply gain. As a result, the first portion 663 of LO light 662 is supplied via SVOA 626 to analyzer circuit 628 for monitoring one or more parameters of the LO light, such as wavelength, laser linewidth, and power. During a second or operational mode, SVOA 626 is biased to be substantially opaque to the LO light, such that such light is blocked from reaching analyzer circuit 628. In the operational mode, as noted above, optical signals λ1TE and λ1TE' are mixed with LO light 672 and 664, respectively, in corresponding optical hybrid circuits 506-1 and 506-2. To block the light may mean blocking 90%, 99%, 99.9%, 99.99%, or any suitable number.

Figure 7:
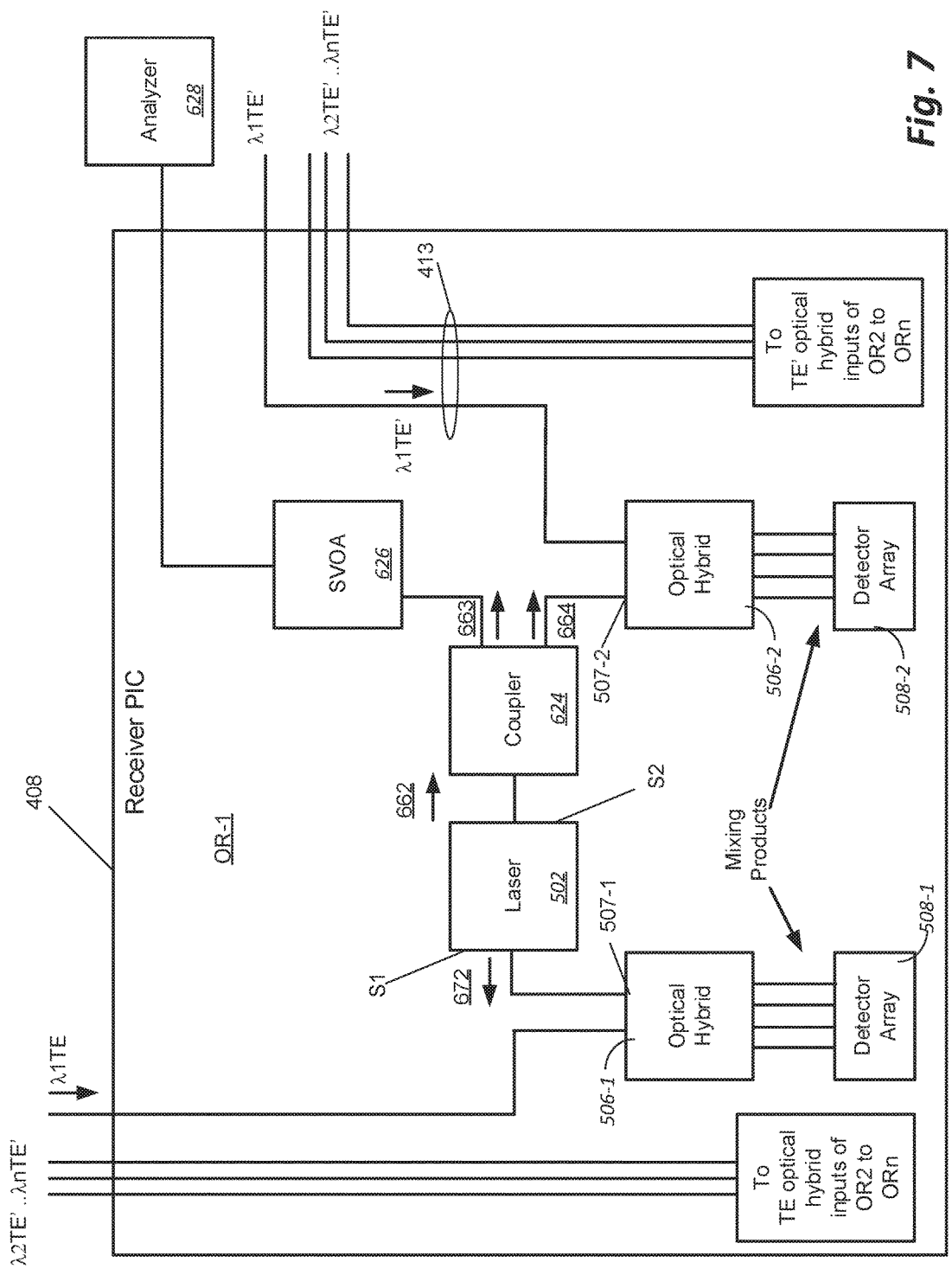

FIG. 7 shows an example of optical receiver circuit OR-1 similar to that shown in FIG. 6. In FIG. 7, however, demultiplexers 410-1 and 410-2 are omitted, such that OR-1 and PIC 408 receive one optical signal, such as λ1TE and λ1TE'. The operation and structure of optical receiver circuit OR-1 shown in FIG. 7 is otherwise the same as or similar to the operation and structure of OR-1 discussed above in connection with FIG. 6.

Figure 8:
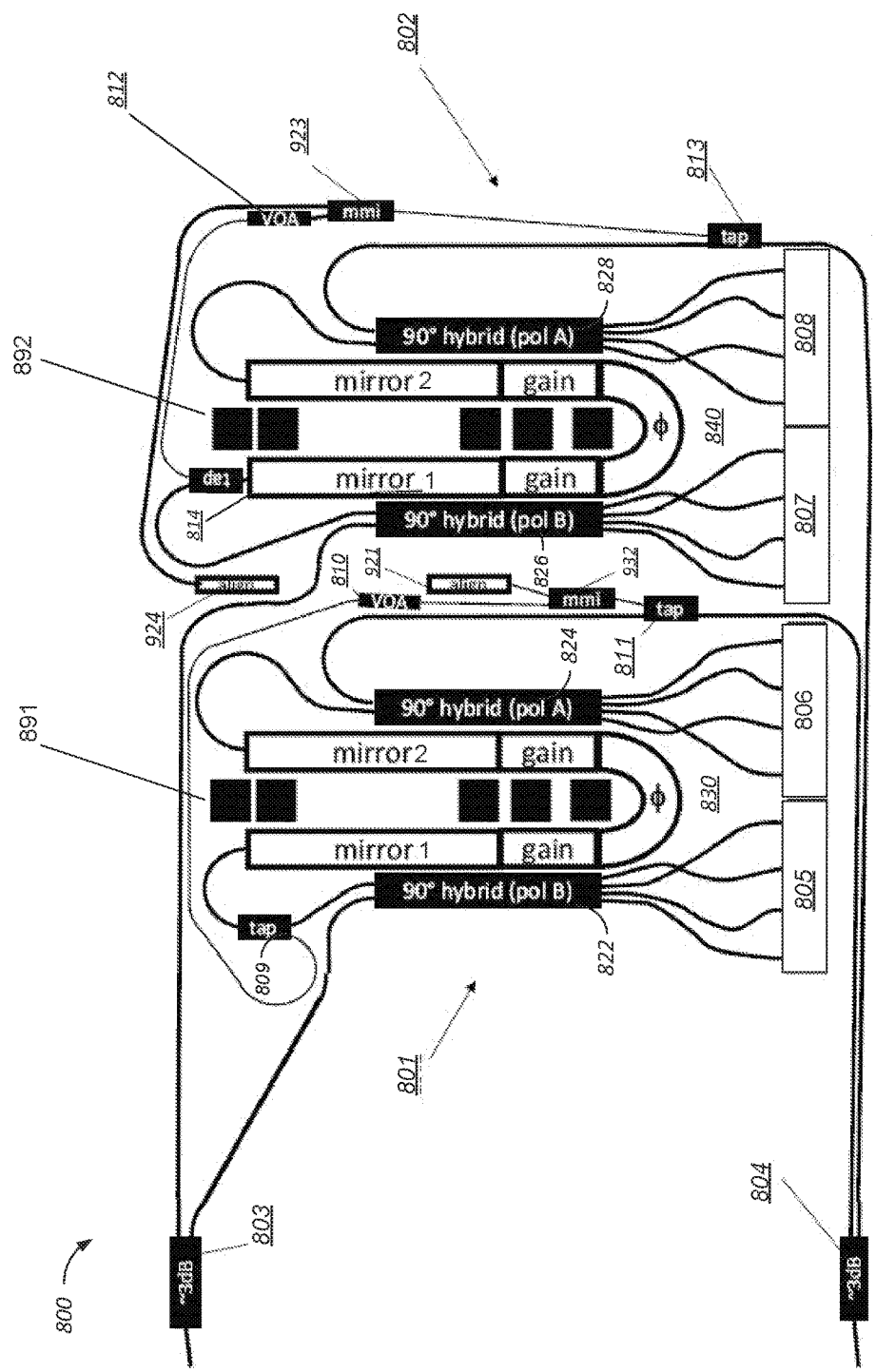
FIGS. 8-9 illustrate examples of a photonic integrated circuit having a shutter variable optical attenuator consistent with further aspects of the present disclosure.

FIG. 8 illustrates receiver PIC 800 including receivers 801 and 802 and respective local oscillator lasers 830 and 840 consistent with an additional aspect of the present disclosure. PIC 800 also includes shutter VOAs 810 and 812. PIC 800 may operate in one of either a test mode or a normal operational mode as described in above with reference to FIGS. 6 and 7.

Receiver 801 includes a LO laser 830, in which one output of the LO laser 830 is coupled to an optical tap 809 and another output of the LO laser 830 is coupled to an optical hybrid 824. A portion of the tapped light from the optical tap 809 is provided to an optical hybrid 822, and another portion of the tapped light from the optical tap 809 is provided to SVOA 810. A data signal (e.g., λ1TE) may be coupled into the PIC 800 through the 3 dB coupler 803, where a portion the data signal (e.g., 50%) is provided to the optical hybrid 822 and another portion (e.g., 50%) the data signal is provided to the optical hybrid 826. Tap 811 sends light through coupler 804 for test analysis. In this way, AC photocurrent is balanced by tapping the local oscillator path on one side and the signal path on the other side rather than tapping both on the one side and not at all on the other side. Control electrodes 891 may be provided to adjust the current supplied to heaters that control the temperature of the reflectors (shown as mirror1 and mirror2) of LO laser 830, as well as the current supplied to the gain and phase sections of LO laser 830. LO laser 830 is shown, in this examples, as having a bent or curved phase adjusting section φ. With this geometry, LO laser 830 and PIC 800 may have a compact layout and chip size.

PIC 800 also includes receiver 802, which has a similar construction as receiver 801. For example, receiver 802 includes an LO laser 840 having first and second outputs adjacent mirror or reflectors mirror1 and mirror2, respectively. The output from mirror1 is supplied to optical tap 814 and the second output of the LO laser 840 from mirror2 is coupled to optical hybrid 828. Control electrodes 892, similar to electrodes 891, may also be provided to adjust the gain and the temperature of the reflector sections (mirror1 and mirror2) of LO laser 840. A portion of the tapped light from the optical tap 814 may be provided to optical hybrid 826, and another portion of the tapped light from the optical tap 814 is provided to SVOA 612. A second data signal (e.g., λ1TE') may be coupled into the PIC 800 through the 3 dB coupler 804, where a portion the data signal λ1TE' (e.g., 50%) is provided to the optical hybrid 824 through the tap 813 and another portion (e.g., 50%) the data signal λ1TE' is provided to the optical hybrid 828 through the optical tap 813.

Alternatively, light from one end of laser 840 may be split by a 3 dB coupler, for example, having first and second output ports. Light from the first output port may be supplied to tap 814 and light from the second output port may be provided to tap 828.

In this example, in the test mode, the SVOA 810 may be biased to be "open". Light output from mirror1 of laser 830 may be split by an optical tap 809, and the split portion 831 may pass through the SVOA 810, another tap 811, and a 3 dB coupler 804 where such light may be detected on-wafer, on-chip or off-chip in order to determine that light output from the LO laser 830 has a desired wavelength and power. In some implementations, other performance metrics of the LO laser 830 may also be detected and analyzed.

In a similar fashion, SVOA 812, which may have a structure similar to or the same as SVOA 810 may be biased in a test mode to transmit light from the LO laser 840 via tap 814. Light output from the SVOA 812 may pass through another tap 813 and the 3 dB coupler 804 for monitoring, as described above. In this example, the optical outputs from both the LO lasers 830 and 840 may be monitored by a single port, e.g., the output port of the 3 dB coupler 804.

In a normal operational mode, SVOA 810 and SVOA 812 are biased to be blocking or substantially opaque. Incoming optical signals λ1TE and λ1TE', for example, are provided to the 3 dB couplers 803 and 804, respectively. As a result, power split portions of λ1TE are supplied to 90 degree optical hybrids 822,824 in receiver 801, and power split portions of λ1TE' are supplied to 90 degree optical hybrids 826, 828 of optical receiver 802. λ1TE portions 641, 642 are thus mixed with LO light 833 and 834. In addition, λ1TE' portions 643 and 644 are mixed with LO light 635 and 636. The resulting mixing products are fed to photodiodes groups 605, 606, 607, and 608, where the mixing products are converted to corresponding electrical signals, which are then processed further (e.g., using coherent detection processing).

In some implementations, the receivers 801 and 802 include fiber alignment devices, such as alignment lasers 921 and 924, respectively, that supply light to corresponding couplers, such as multimode interference (MMI) couplers 932 and 923. Light from alignment lasers 921 and 924 may then be passed through taps 811 and 813, respectively and through 3 dB coupler 804. Detectors spaced from coupler 804 may then be provided to sense such light to insure proper alignment between the PIC 800 and other devices.

Figure 9:
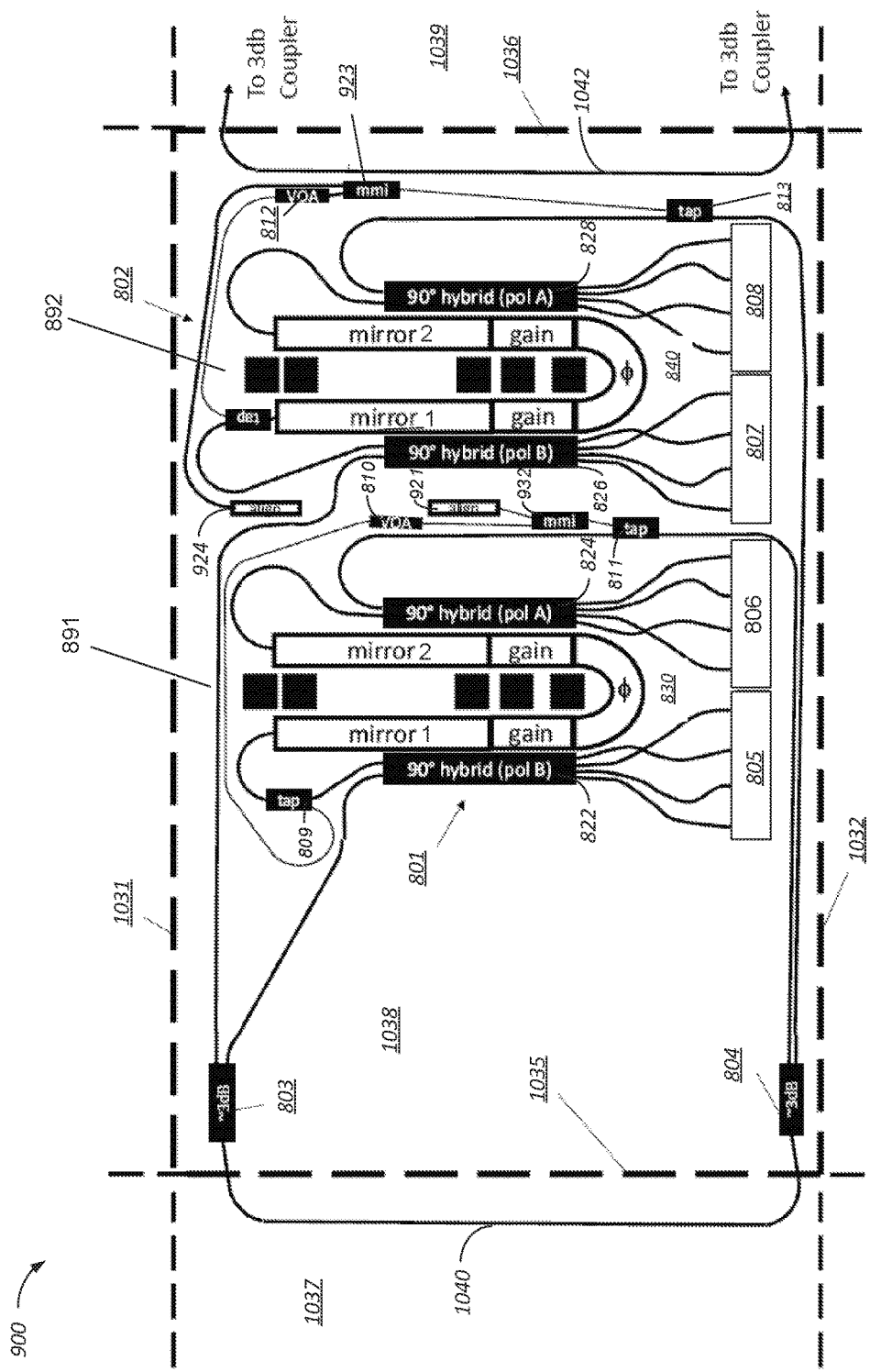
Figure 10:
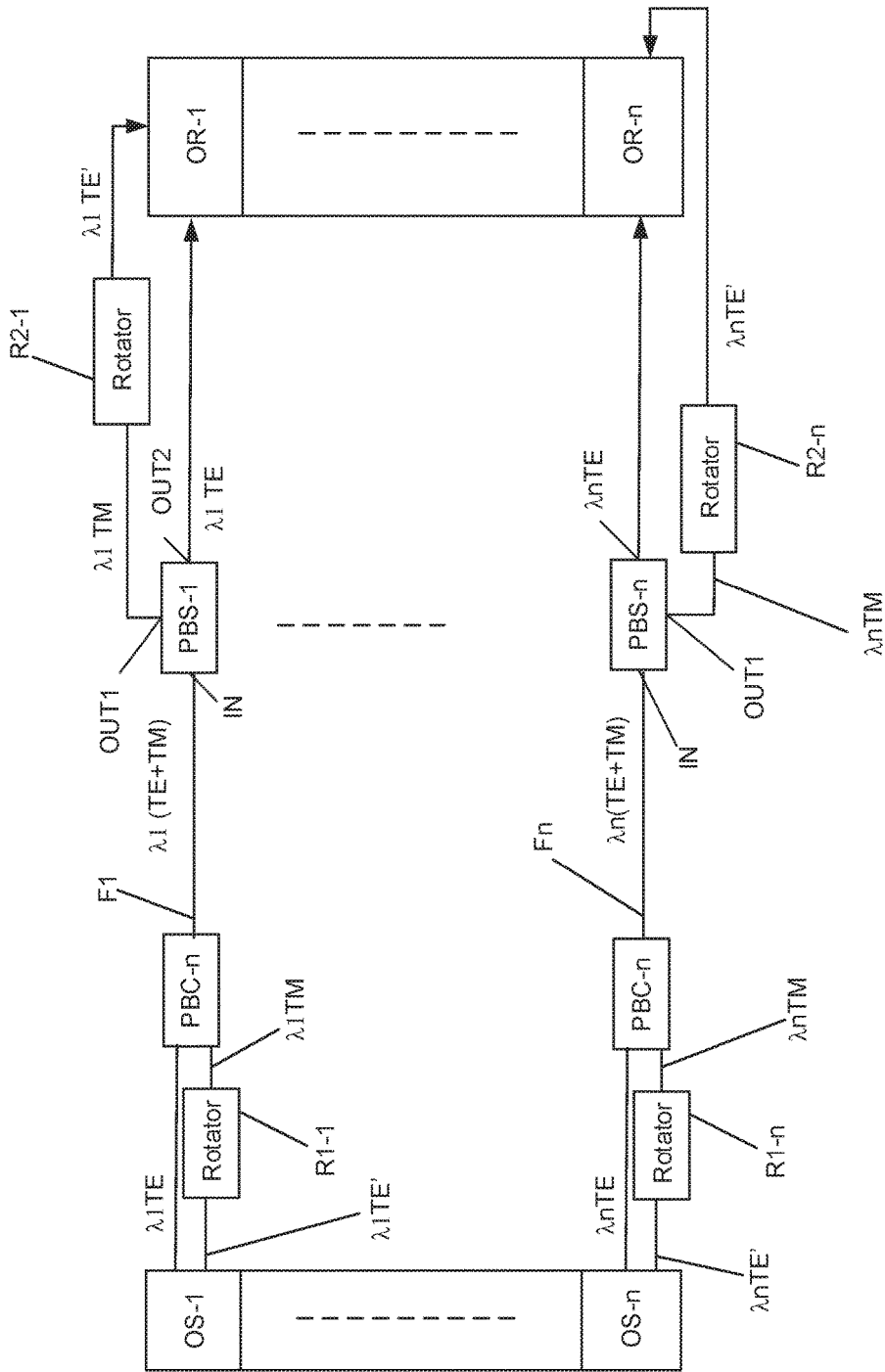
FIG. 10 shows an example of a communication system having an N×N configuration consistent with an additional aspect of the present disclosure.

FIG. 9 illustrates an example receiver PIC 900 for on-chip/wafer testing. The PIC 900 is similar to the PIC 800 discussed above with reference to FIG. 8. FIG. 10, however, shows an enlarged view of a wafer including scribe lines 1031 and 1032 extending parallel to one another and horizontally, as well as scribe lines 1035 and 1036 that extend parallel to one another and vertically. The scribe lines define dies or die regions 1037, 1038, and 1039. Die region 1038 is shown having receivers 801 and 802 having the same or similar structure and operation as receivers 801 and 802 discussed above in connection with FIG. 9. It is understood that die regions 1037 and 1039 may have receivers similar to or the same as 801 and 802 in FIG. 10, and that other receivers (not shown) may be provided in these die regions.

As further shown in FIG. 9, waveguide 1040 may be provided in die region 1037, such that waveguide 1040 loops back to optically connect 3 dB coupler 803 to 3 dB coupler 804. In order to test waveguide continuity and operation of the photodiodes, the local oscillator lasers 830 and 840 of FIG. 10 may supply light that is output from 3 dB coupler 804 in a manner similar to that described above. In addition to or instead of such LO light, alignment lasers 921 and 923 may be turned on to supply light that may also be output from 3 dB coupler 804. Light output from 3 dB coupler 804 may be fed to the waveguide 1040 which supplies the light to 3 dB coupler 803, which, in turn, directs the light to the 90 degree optical hybrids 822 and 866 in receivers 801 and 802, respectively. Such light may then pass through the optical hybrids 822 and 826 and to the photodiodes 805 and 807 in each receiver, where the light may be detected for monitoring, alignment, and/or diagnostic purposes. Waveguide 1042 may also be provided to facilitate such monitoring, alignment, and diagnostics of receivers in die region 1039.

To package the PIC 1000, the wafer may be scribed or cleaved along singulation lines 1031, 1032, 1034, and 1035, and 3 dB couplers 803 and 804 may be optically coupled to receive incoming TE and TE' optical signals.

Other embodiments will be apparent to those skilled in the art from consideration of the specification. It is intended that the specification and examples be considered as exemplary only.

For example, in the above examples, optical signals generated by transmit blocks 12-1 to 12-n are combined onto one optical communication path or fiber 16 in FIG. 1. Such optical signals are then demultiplexed or separated from one another at receive node 18. Consistent with an aspect of the present disclosure, however, polarization multiplexed optical signals, each at a corresponding one of a plurality of wavelengths, may be transmitted on a respective one of a plurality of fibers in a so-called N×N configuration. For example, system 1000 shown in FIG. 10 may include optical sources OS-1 to OS-n having the same or similar structure and operating in the same or in a similar fashion as the optical source discussed above. As further noted above, optical sources OS-1 to OSn may output pairs of optical signals at each wavelength λ1 to λn. λ1TE and λ1TE', as well as λnTE and λnTE', are examples of such pairs. The polarization of each of optical signals λ1TE' to λnTE' may be supplied to a corresponding one of first polarization rotators R1-1 to R1-n, each of which polarization rotates the received optical signal to have a TM polarization. As a result, each of optical signals λ1TM to λnTM is output from a corresponding one of rotators R1-1 to R1-n. Optical signals pairs λ1TE, λ1TM . . . λnTE, λnTM are next fed to a respective one of polarization beam combiners PBC-1 to PBC-n, and the polarization multiplexed optical signal (having both TE and TM components) output from each polarization beam combiner, i.e., a corresponding one of optical signals λ1(TE+TM) . . . λn(TE+TM), is supplied to a respective one of optical fibers F1 to Fn, for example.

At a receive end of each optical fiber F1 to Fn, each of optical signals λ1(TE+TM) . . . λn(TE+TM) is supplied to an input IN corresponding one of polarization beam splitters PBS-1 to PBS-n. Each of polarization beam splitters PBS-1 to PBS-n supplies the TM component, e.g., λ1TM, of each such optical signal at output OUT1 and the TE component of each such optical signal, e.g., λ1TE, at output OUT2 of each PBS. Each of TM components λ1TM to λnTM is provided to a respective one of second rotators R2-1 to R2-n, which rotate the polarization of each such TM component to have a TE polarization. Each of the resulting optical signals λ1TE' to λnTE', along with a respective one of optical signals λ1TE to λnTE, are supplied to corresponding one of optical receivers OR-1 to OR-n, which process such optical signal in a manner similar to or the same as that described above.

While this document may describe many specifics, these should not be construed as limitations on the scope of an invention that is claimed or of what may be claimed, but rather as descriptions of features specific to particular embodiments. Certain features that are described in this document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or a variation of a sub-combination. Similarly, while operations are depicted in the drawings in a particular order, this should not be understood as requiring that such operations be performed in the particular order shown or in sequential order, or that all illustrated operations be performed, to achieve desirable results.

Only a few examples and implementations are disclosed. Variations, modifications, and enhancements to the described examples and implementations and other implementations can be made based on what is disclosed.

What is claimed is:

1. Optical receiver, comprising:
   a substrate;
   a local oscillator (LO) laser provided on the substrate, the LO laser having first and second sides and outputting first light from the first side and second light from the second side, the first light output from the first side of the laser has a first power and the second light output from the second side has a second power;
   a first plurality of photodiodes receiving first mixing products including portions of the first light and portions of a first optical signal;
   a second plurality of photodiodes receiving second mixing products including portions of the second light and portions of a second optical signal;
   a first optical path extending from the first side of the LO laser to the first plurality of photodiodes and a second optical path extending from the second side of the LO laser to the second plurality of photodiodes, the first path having an associated first optical loss and the second path having an associated second optical loss, wherein the first light has a first power and the second light has a second power at the first and second sides, respectively, such that portions of the first light received by the first plurality of photodiodes have substantially the same power as portions of the second light received by the second plurality of photodiodes.

2. An optical receiver in accordance with claim 1, further including an optical coupler optically communicating with the first side of the LO laser and receiving the first light.

3. An optical receiver in accordance with claim 2, wherein the optical coupler has an associated optical loss, the second power of the second light output from the second side being greater than the first power of the first light output from the first side, the second power offsetting the optical loss.

4. An optical receiver in accordance with claim 2, wherein the coupler has first and second outputs, the first plurality of photodiodes optically communicating with the first output, the optical receiver further including a device coupled to the second output.

5. An optical receiver in accordance with claim 4, wherein the device includes a waveguide that disperses a portion of the first light supplied from the second output of the coupler.

6. An optical receiver in accordance with claim 2, wherein the coupler is a multimode interference (MMI) coupler.

7. An optical receiver in accordance with claim 1, wherein the LO laser includes a first reflector adjacent the first side and a second reflector adjacent the second sides, the first reflector having a first reflectivity and the second reflector having a second reflectivity.

8. An optical receiver in accordance with claim 7, wherein the first reflector has a first plurality of grating teeth and the second reflector has a second plurality of grating teeth, a number of the first plurality of grating teeth being different than a number of the second plurality of grating teeth.

9. A receiver in accordance with claim 1, further including a coupler coupled along the second path, the coupler having a first output and a second output, the first output optically communicating with a control circuit that monitors the second light, and the second output optically communicates with the second plurality of photodiodes.

10. A receiver in accordance with claim 9, wherein the coupler is a first coupler further including:
   a variable optical attenuator optically communicating with the first output of the first coupler; and
   a second coupler having an input that optically communicates with variable optical attenuator and an output that optically communicates with the control circuit.

11. A receiver in accordance with claim 9, further including:
   a delay line interferometer provided on the substrate, the delay line interferometer having an input that optically communicates with the first output of the coupler and an output; and
   a photodetector that optically communicates with the output of the delay line interferometer, wherein a digital signal processor offsets effects of phase noise in the first and second lights based on an output of the photodetector.

12. An optical receiver in accordance with claim 1, further including a first optical hybrid circuit provided along the first optical path and a second optical hybrid circuit provided along the second optical path.

13. An optical receiver, comprising:
   a local oscillator (LO) laser having first and second sides and outputting first light from the first side and second light from the second side;
   a coupler that receives the first light, the coupler having first and second outputs, the first output supplying a first portion of the first light and the second output supplying a second portion of the first light;
   a first optical hybrid that receives the first portion of the first light;
   a second optical hybrid that receives the second portion of the first light; and
   a control circuit optically communicating with the second side of the LO laser, the control circuit receiving at least a portion of the second light and monitoring the second light.

14. An optical receiver in accordance with claim 13, wherein the LO laser includes a first reflector adjacent the first side and a second reflector adjacent the second side, the first reflector having a reflectivity that is less than a reflectivity of the second reflector.

15. An optical receiver, comprising:
   a local oscillator (LO) laser that output light;
   a first coupler that receives the light, the coupler having first and second outputs, the first output supplying a first portion of the light and the second output supplying a second portion of the light;
   a second coupler having an input that receives the first portion of the light, the second coupler having a first output that supplies a third portion of the light and a second output that supplies a fourth portion of the light;
   a first optical hybrid circuit that receives the third portion of the light;
   a second optical hybrid circuit that receives the fourth portion of the light; and
   a control circuit optically communicating with the second output of the first coupler, the control circuit receiving at least a portion of the second portion of the light, the control circuit monitoring the second portion of the light.

* * * * *